United States Patent
Roge et al.

(10) Patent No.: US 7,983,094 B1
(45) Date of Patent: Jul. 19, 2011

(54) PVT COMPENSATED AUTO-CALIBRATION SCHEME FOR DDR3

(75) Inventors: Manoj B. Roge, San Jose, CA (US); Andrew Bellis, Guildford (GB); Philip Clarke, Leatherhead (GB); Joseph Huang, Morgan Hill, CA (US); Michael H. M. Chu, Fremont, CA (US); Yan Chong, San Jose, CA (US)

(73) Assignee: Altera Corporation, San Jose, CA (US)

( * ) Notice: Subject to any disclaimer, the term of this patent is extended or adjusted under 35 U.S.C. 154(b) by 35 days.

(21) Appl. No.: 12/539,594

(22) Filed: Aug. 11, 2009

Related U.S. Application Data

(63) Continuation of application No. 11/936,036, filed on Nov. 6, 2007, now Pat. No. 7,590,008.

(60) Provisional application No. 60/857,467, filed on Nov. 6, 2006.

(51) Int. Cl.
*G11C 7/00* (2006.01)
*G11C 8/00* (2006.01)

(52) U.S. Cl. ............... 365/189.011; 365/193; 365/194; 365/233.1; 365/233.13

(58) Field of Classification Search ............ 365/233.13
See application file for complete search history.

(56) References Cited

U.S. PATENT DOCUMENTS

| | | | | |
|---|---|---|---|---|
| 6,600,681 | B1 * | 7/2003 | Korger et al. | 365/193 |
| 6,646,929 | B1 * | 11/2003 | Moss et al. | 365/194 |
| 6,707,723 | B2 * | 3/2004 | Jeong | 365/189.05 |
| 7,042,799 | B2 | 5/2006 | Cho | |
| 7,173,866 | B2 * | 2/2007 | Na et al. | 365/193 |
| 7,379,383 | B2 * | 5/2008 | Kao | 365/233.17 |
| 7,394,707 | B2 * | 7/2008 | Seto et al. | 365/193 |
| 7,463,534 | B2 | 12/2008 | Ku et al. | |
| 7,580,301 | B2 * | 8/2009 | Cheng | 365/194 |
| 7,719,904 | B2 * | 5/2010 | Lee | 365/189.16 |
| 2007/0230266 | A1 | 10/2007 | Kao | |

* cited by examiner

*Primary Examiner* — Tan T. Nguyen
(74) *Attorney, Agent, or Firm* — Ropes & Gray LLP

(57) ABSTRACT

Circuits, methods, and apparatus that provide the calibration of input and output circuits for a high-speed memory interface. Timing errors caused by the fly-by routing of a clock signal provided by the memory interface are calibrated for both read and write paths. This includes adjusting read and write DQS signal timing for each DQ/DQS group, as well as inserting or bypassing registers when timing errors are more than one clock cycle. Timing skew caused by trace and driver mismatches between CK, DQ, and DQS signals are compensated for. One or more of these calibrations may be updated by a tracking routine during device operation.

20 Claims, 22 Drawing Sheets

PVT COMPENSATED AUTO-CALIBRATION SCHEME FOR DDR3

CROSS-REFERENCES TO RELATED APPLICATIONS

This application is a continuation of U.S. patent application Ser. No. 11/936,036, filed Nov. 6, 2007 now U.S. Pat. No. 7,590,008, which claims the benefit of U.S. provisional application No. 60/857,467, filed Nov. 6, 2006, both of which are incorporated by reference.

BACKGROUND

The present invention relates generally to high-speed multiple data-rate memory interface circuits and more specifically to the calibration of these memory interface circuits.

Multiple data-rate interfaces, such as double data-rate interfaces, have become increasingly common. One such type of interface, the double data-rate (DDR) interface, communicates two bits of data per clock cycle at each data line. DDR interfaces are often used with high-speed memory devices, as well as other types of devices.

As DDR interfaces increase in speed, timing margins become smaller and more susceptible to error. For example, the accuracy in the timing between a clock signal and a data strobe signal (DQS) provided by a memory interface to a device such as a memory can be particularly important. Other margins, such as skew among data signals (DQ) and between DQ and DQS signals, also become increasingly important.

Typical DDR signals include DQS and DQ signals provided by a transmitting device and received by a receiver. The transmitting and receiving devices may include integrated circuits, such as FPGAs, and a number of memory devices. Typically, the FPGA or other integrated circuit controls the timing and frequency of operation by providing a clock signal CK to the memory devices.

In some DDR topologies, the clock signal provided by the transmitting device is provided to a number of memory devices in series, that is, to a first memory device, then a second, then a third, and so on. This topology is referred to as a "fly-by" topology and may also be used for control and address signals. The use of this routing means that each memory device receives the clock signal at a different time. The timing of data transfers, both to and from the memory devices, must be adjusted. Further, the CK output and the various DQ and DQS input and outputs may have mismatches in trace length, capacitances, driver strength, and other parameters such that signals on these lines may be skewed relative to each other. Moreover, the timing errors caused by the fly-by topology and these various skews and mismatches typically change during device operation as a function of FPGA temperature and supply voltage.

It is therefore desirable for a memory interface on the FPGA or other integrated circuit to compensate for the different arrival times of the CK signal at different memory devices. It is also desirable to efficiently compensate for skew between CK, DQS, and DQ signals received from and provided to a memory device. Further, it is desirable to be able to update these compensations for changes in temperature and voltage while the device is operating.

SUMMARY

Accordingly, embodiments of the present invention provide circuits, methods, and apparatus that provide for the calibration of input and output circuits for a high-speed memory interface. Timing errors caused by the fly-by routing of a clock signal provided by the memory interface are calibrated for both read and write paths. This includes adjusting DQS signal timing for each DQ/DQS group, as well as inserting or bypassing registers when timing differences are more than one clock cycle relative to an internal clock domain. Timing skews caused by trace and driver mismatches between CK, DQ, and DQS signals are compensated for. One or more of these calibrations can be updated by an appropriate tracking routine during device operation.

An exemplary embodiment of the present invention compensates for the skew in timing signals caused by the routing of a clock line using a fly-by topology. A write leveling operation is performed where the DQS signal in each DQ/DQS group is shifted to be substantially aligned with the CK clock signal at its receiving memory device. In a specific embodiment of the present invention, both the clock signal that clocks the DQS output flip-flops and a delay line in the DQS signal path are calibrated. During data reception, an intermediate register is used to facilitate the transfer of data from the DQS domain to an internal clock domain. The phase of a clock signal for the intermediate or resynchronization (resync) register is calibrated. Since the CK signal skew may be more than one clock cycle, registers that delay signals by one or more clock cycles may be inserted or bypassed in both the write and read paths.

Another exemplary embodiment of the present invention calibrates the skew among DQ signals in a group and between the DQS signal and DQ signals in a group. Delays are inserted in DQS and DQ write and read signal paths. The delays are adjusted to compensate for trace, driver, and other variations that cause timing mismatches between the signals.

A further exemplary embodiment of the present invention calibrates the gating of DQS signals to prevent the spurious clocking of registers by glitches that result when DQS signal drivers return to a high-impedance state. The DQS signals are gated using a postamble enable signal. The generation of this postamble enable signal also delays the beginning of a DQS signal enable time to avoid glitches at the end of one postamble period from clocking an input register during the beginning of a second non-consecutive read that is temporally nearby.

Another exemplary embodiment of the present invention tracks parameters on the FPGA during device operation. This tracking provides information that may be used to update the calibration results determined during the procedures listed above to compensate for changes in temperature and supply voltage. A specific embodiment of the present invention tracks and compensates for changes in a circuit designed to provide a nominal 90 degree phase shift for the DQS signals, as well as timing for the resync registers and registers used in the postamble enable signal generation.

Various embodiments of the present invention may incorporate one or more of these or the other elements discussed herein. A better understanding of the nature and advantages of the present invention may be gained with reference to the following detailed description and the accompanying drawings.

DESCRIPTION OF EXEMPLARY EMBODIMENTS

Figure 1:
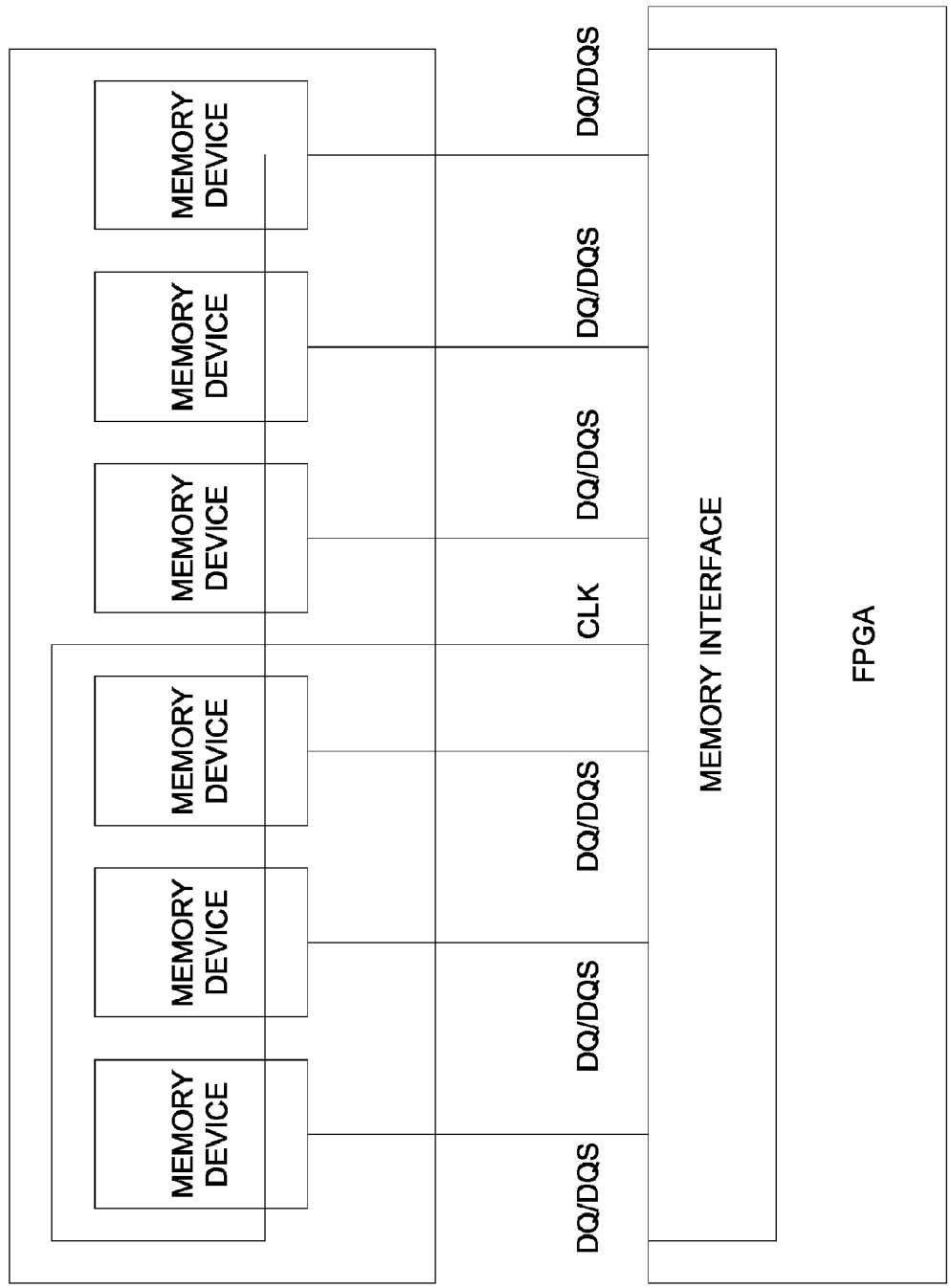
FIG. 1 is a block diagram of a memory circuit including a memory interface that is improved by the incorporation of an embodiment of the present invention.

FIG. 1 is a block diagram of a memory circuit including a memory interface that is improved by the incorporation of an embodiment of the present invention. This diagram includes a memory unit made up of a number of memory devices that are in communication with an integrated circuit, shown here as an FPGA, including a memory interface. This figure, as with the other included figures, is shown for illustrative purposes and does not limit either the possible embodiments of the present invention or the claims.

In this particular example, the integrated circuit is an FPGA. While embodiments of the present invention may be incorporated in other types of integrated circuits, they are particularly useful in FPGAs and other programmable circuits. The memory interface on the integrated circuit communicates with the memory devices over a number of bidirectional DQ/DQS signal lines. Specifically, data is transferred between the FPGA and memory devices on the DQ lines while these data signals are clocked by their corresponding DQS signals. When the FPGA reads data from the memory, the memory devices provide the DQ and DQS signals. When the FPGA writes data to the memory devices, the memory interface provides the DQ and DQS signals to the memory devices.

Timing of these data transfers is controlled by a clock signal that is provided by the memory interface to the memory devices. The routing of the clock line in DDR3 circuits uses a fly-by topology. Specifically, the clock is routed to a number of memory devices in a sequential manner. In this example, the clock signal is received by the leftmost memory device first, and by the rightmost memory device sometime later. This difference in clock reception by the memory devices results in data being received from the memory devices at different times. Specifically, during read operations, data is typically received at the memory interface from the leftmost memory device first, and from the rightmost memory device sometime later. Moreover, during write operations, unless compensated for, the various memory devices receive the DQ and DQS signals at different times relative to the clock signal. This complicates the reception of data by the memory devices. These problems caused by the memory devices receiving the clock signal at different times are compensated for by embodiments of the present invention.

Other timing problems arise at memory interfaces such as the one shown here. For example, during both read and write operations, the various DQ signals in a DQ/DQS group may be skewed relative to each other. These skews may be caused by differences in trace length trace and pin capacitances, and other such mismatches in the path lines. These skews can also addressed by embodiments of the present invention.

Once these timing adjustments have been made, they and the underlying errors that they are correcting may vary due to environmental changes including changes in temperature and supply voltage. Accordingly, embodiments of the present invention track these changes and make appropriate adjustments. An outline illustrating this process is shown in the following figure.

Figure 2:
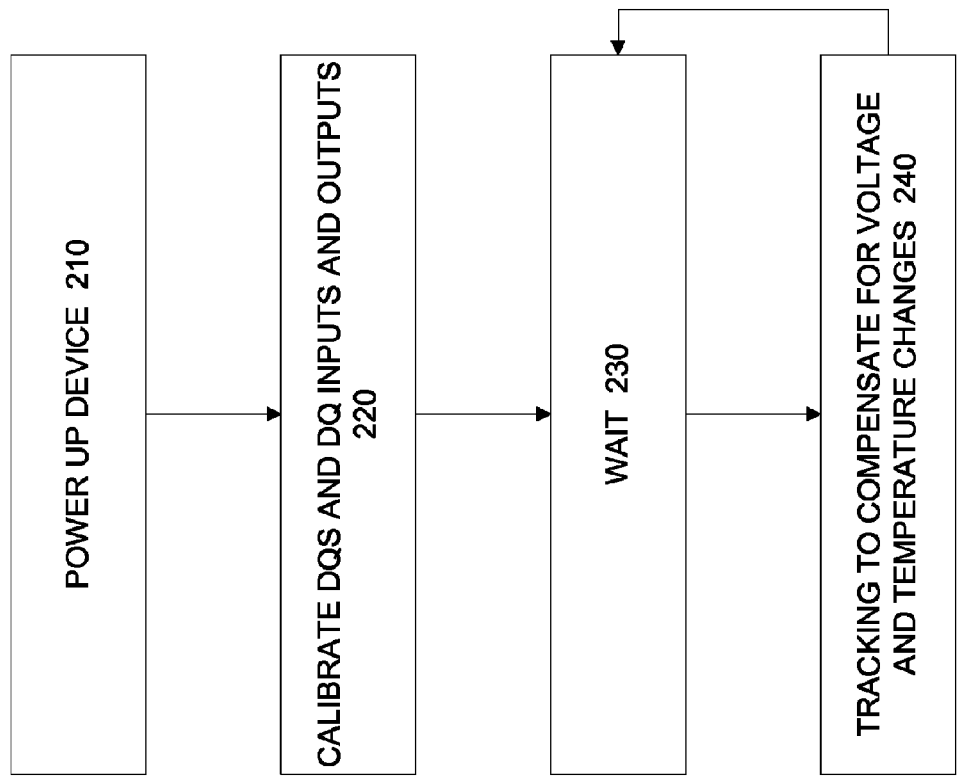
FIG. 2 is a flowchart illustrating a method of calibrating and updating the calibration of a memory interface according to an embodiment of the present invention.

FIG. 2 is a flowchart illustrating a method of calibrating a memory interface according to an embodiment of the present invention. Initially, the device is powered up and initialized in act 210. In act 220, memory interface inputs and outputs are calibrated. Again, this calibration procedure may compensate for the differences in clock timing among memory devices during read and write operations. The calibration procedure may also deskew individual DQ and DQS signals relative to each other during read and write operations. Other adjustments may be performed, examples of which are shown in figures below.

In act 230, the memory interface waits for a period of time. During this time, the memory interface may operate; that is, it may write and read data to and from the memory devices. In act 240, tracking to compensate for voltage and temperature changes occurs. Some or all of the tracking may also take place during the wait time 230. Further details of the calibration of the inputs and outputs are shown in the following figure.

Figure 3:
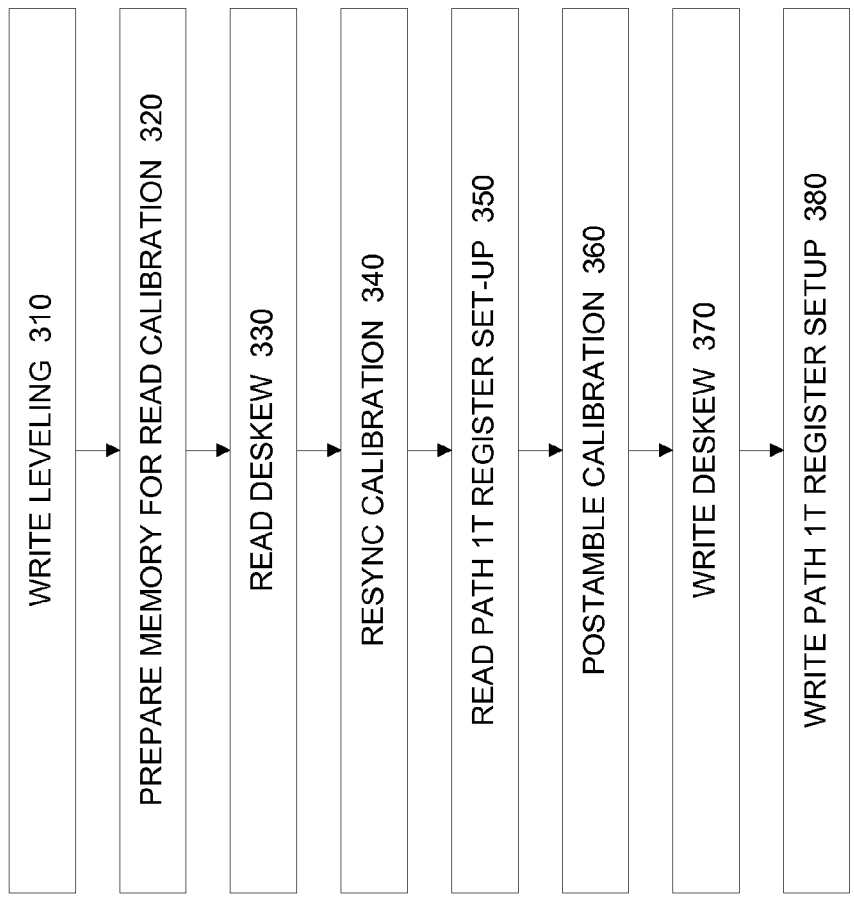
FIG. 3 illustrates a method of calibrating a memory interface according to an embodiment of the present invention.

FIG. 3 illustrates a method of calibrating a memory interface according to an embodiment of the present invention. In act 310, a write leveling procedure is performed. This procedure aligns DQS signals provided by the memory interface during a write operation to the clock signal such that the DQS and clock signals are received at the memory devices in a substantially aligned manner. In act 320, data is written to the memory, such that it can be read back during read calibration operations. In act 330, a read-path deskew is performed, where delays in series with the DQ and DQS inputs are adjusted to compensate for trace and driver mismatches in the data read path.

When data is received by memory interface, it is initially clocked by a DQS signal received from the memory interface. To be used internally, this data needs to be retimed to an internal clock. This retiming can be achieved by using an intermediate resynchronization stage that is calibrated in act 340.

In some circuits, the difference in the time of reception of the clock signal by different memory devices and trace routing delays may cause the read data to arrive in different clock cycles in the receiving memory interface. Accordingly, a register referred to as a 1T register is inserted in the read path and is either used or bypassed such that DQ signals from all memory devices are internally aligned. These 1T registers are set up in act 350.

At the end of a data read, a postamble signal consisting of a one-half cycle having a low level is received on the DQS input. After the postamble period, the drivers providing the DQS signals return to the high impedance state. At the return to a high impedance state, glitches may occur resulting in spurious clock signals being received by input registers in the memory interface. Accordingly, the DQS signals are each gated by a postamble enable signal. These postamble enable signals are calibrated in act 360.

The individual signals provided by the memory interface are deskewed in act 370. Similar to the read path, the write path may write to memory devices having a clock signal delayed by more than one clock cycle. Accordingly, 1T registers are included in the write path. These registers may be inserted or bypassed. These registers are set up in act 380.

In embodiments of the present invention, some or all of these, as well as other parameters may be calibrated. This calibration may follow a power-up act as shown in FIG. 3, or the parameters may be calibrated at other appropriate times, such as during a reset or other activity. Moreover, in various embodiments of the present invention, these steps may be performed in a different order. In this example, the write leveling procedure is done first. This allows data needed for read calibration to be written correctly to the memory. A flowchart of a write leveling procedure is shown in the following figure.

Figure 4:
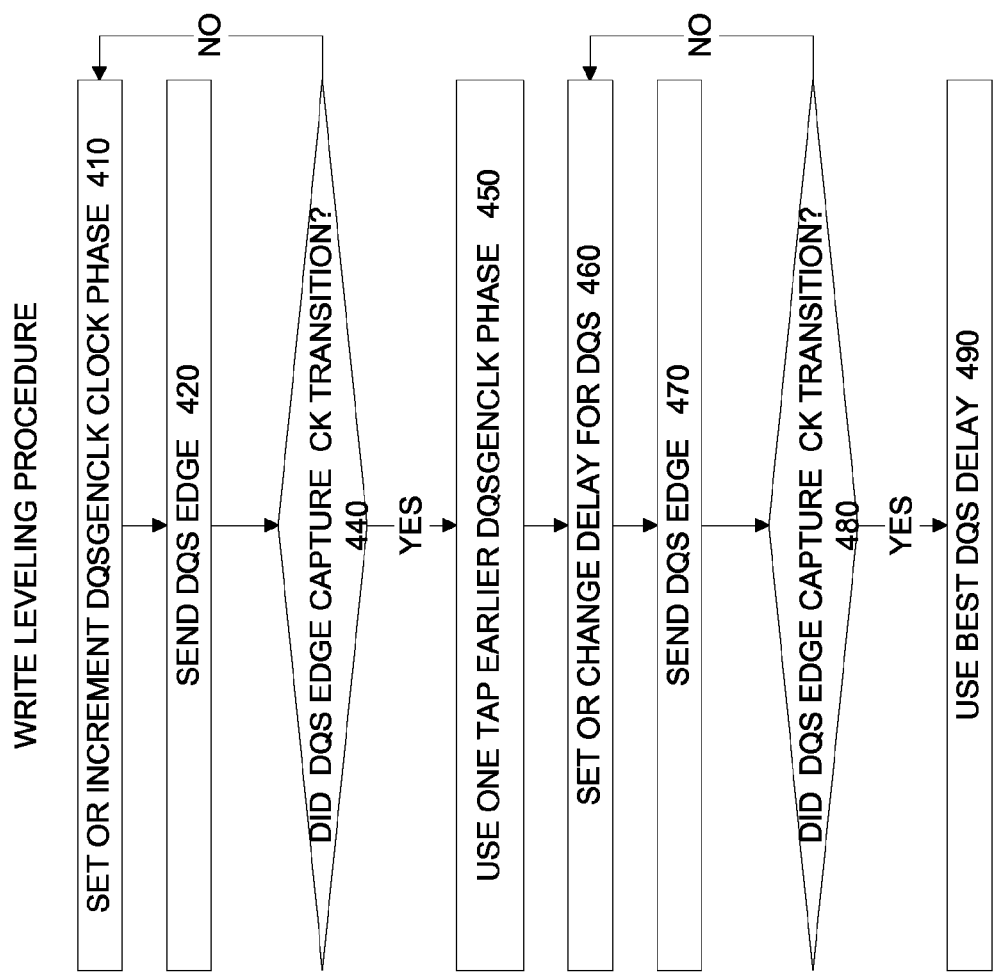
FIG. 4 is a flowchart illustrating a write leveling procedure according to an embodiment of the present invention.

FIG. 4 is a flowchart illustrating a write leveling procedure according to an embodiment of the present invention. In this method, a system clock and one or more DQS signals are provided to a memory. The timing of the DQS signals are adjusted such that rising edges of the DQS signal and the system clock arrive at a memory device at substantially the same time. This calibration may be done by setting a phase of a clock for the circuits generating each DQS signal, then adjusting a delay in series with each DQS output.

Specifically, in act 410, a phase for a clock signal used to generate a DQS signal is set with an initial value. In this example, this clock signal is referred to as DQSGENCLK. In act 420, a DQS edge is sent to the memory. During this time, the system clock signal can continue to run. In act 440, it is determined whether a transition in the level of the system clock (from low to high) was detected using the rising edge of the DQS signal. If not, the phase of DQSGENCLK is changed in act 410. Once a transition in the system clock is detected, a phase for DQSGENCLK that is one step away from the phase that resulted in the transition is selected in act 450.

In a specific embodiment of the present invention, the DQSGENCLK signal is incrementally increased until an edge of the DQS signal captures a system clock rising edge. Once this occurs, the DQSGENCLK phase that is one increment earlier is selected. Using that setting, the delay is incrementally increased until the DQS signal once again captures a system clock rising edge. In other embodiments of the present invention, other procedures can be used, for example, the delays may be incrementally decreased, or other patterns of changing the DQS timing may be used. For example, each of the phases may be swept for all the DQ/DQS groups. Once the correct phase for each DQS signal is determined, that phase is used, and the delays are swept for all the DQ/DQS groups.

In act 460, a delay for the write DQS signal is set at an initial value. Again, a DQS edge is sent to a memory device in act 470. In act 480, it is determined whether the edge of the DQS signal captured a transition in the system clock. If not, the DQSGENCLK delay is changed in act 460. Once an appropriate system clock transition is captured or the range of delay values are exhausted, the best DQS phase and delay combination is applied in act 490. An example circuit that may be used to perform these steps is shown in the following figure.

Figure 5:
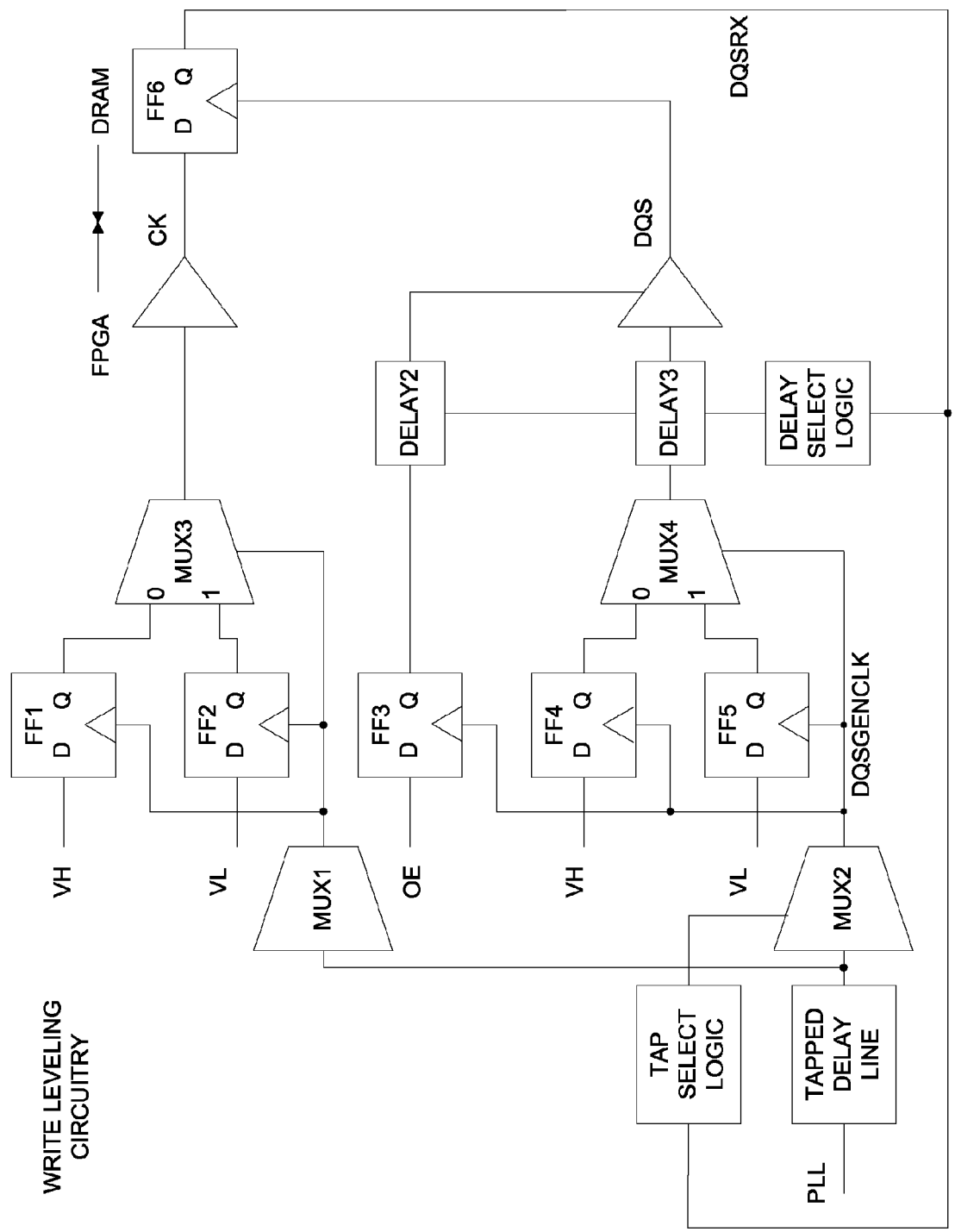
FIG. 5 is a schematic of a circuit that may be used during a write leveling procedure according to an embodiment of the present invention.

FIG. 5 is a schematic of a circuit that may be used during a write leveling procedure according to an embodiment of the present invention. In this circuit, flip-flops FF1 and FF2 and multiplexer MUX3 are used to generate a clock signal CK. Specifically, the outputs of FF1 and FF2 provide high and low signals that are alternately selected by multiplexer MUX3 that provides the clock output. Similarly, flip-flops FF4 and FF5, along with multiplexer MUX4, are used to generate a DQS signal. The DQS signal is delayed by a delay circuit DELAY3. In this example, the DQ signal path includes an output buffer that is enabled by flip-flop FF3. The output of the flip-flop FF3 is similarly delayed by a delay element DELAY2.

The generated clock CK and DQS signals are received by flip-flop FF6 in the DRAM. Specifically, the clock signal CK is received at the D input while the DQS signal is received at its clock input. The output of FF6 is returned to the memory interface as DQSRX. In the specific case of DDR3 this signal is returned via the DQ pin, but it a more general case it could be via another pin or mechanism.

This received DQS signal DQSRX is used to adjust the timing of the clock signal DQSGENCLK that clocks the flip-flops FF3, FF4, and FF5. Specifically, a clock signal generated by a PLL is received by a tapped delay line. The Tapped Delay Line provides a number of clock signals phase shifted relative to each other. The outputs of the tapped delay line are selected by multiplexer MUX2 under the control of the Tap Select Logic. The output of the multiplexer MUX2 provides the clock signal for flip-flops FF3, FF4, and FF5. Multiplexer MUX1 is a dummy multiplexer inserted to match the delay provided by multiplexer MUX2. Conventionally, multiplexer MUX1 selects the zero phase-shifted output of the tapped delay line and uses this to generate the clock signal. In this way, the Tap Select Logic selects the appropriate output of the tapped delay line such that the DQS and CK signals are at least substantially edge aligned when they are received by the DRAM. It will be appreciated that the CK and DQS signals will not be perfectly aligned in all cases. For example, the resolution of the tapped delay line and DELAY3 are not infinite; there will be some residual quantization error among other sources of error. This is typically true of all the outlined calibration procedures.

In a specific embodiment of the present invention, the selection of the appropriate clock phase clocking the flip-flops FF3, FF4, provides a coarse adjustment for the write leveling. Further adjustment is provided by the delay elements DELAY2 and DELAY3. Again, DELAY3 is adjusted such that DQS and the clock signal CK are aligned at the DRAM device. By adjusting the phase of the clock and the delay as shown, the DQS signal is delayed an appropriate amount to match the delay in the clock signal CK that results from the fly-by topology shown in FIG. 1. In other embodiments of the present invention, this circuitry can be used to adjust the DQS signal to compensate for other sources of skew between the clock CK and DQS signals.

Again, two circuits are used to substantially edge align each DQS output signal to the system clock signal CK at a memory device, such that each DQS and the system clock CK are received at a memory device at substantially the same time. The first is a tapped delay line that generates a number of clock signals having different phases. A clock signal is selected and used to generate the DQS signal. This delay line is typically compensated for temperature and supply voltage variations. The second is a delay line inserted in the DQS signal path. This delay line is typically not temperate and voltage compensated, though in various embodiments it may be. For DDR3, the combination of these circuits needs to reduce the skew between a DQS signal and the system clock to meet the T(DQSS) specification. In a specific embodiment of the present invention, the tapped delay line provides a delay that is one-eighth of a clock cycle. This delay is divided among 8 taps, each tap having 12 ps in resolution. Accordingly, the phase of the DQSGENCLK can be adjusted such that a DQS and system clock are within 45 degrees. Also in this specific embodiment, the delay line has 15 step settings, each having a resolution of 50 ps. Thus, this scheme allows each DQS signal to be aligned to within 50 ps of the system clock at its respective memory device excluding the effects of jitter and measurement uncertainties. The result is that the DQS signal and system clock are received in close temporal proximity at the memory device.

Once the write leveling circuitry has been calibrated, data can be written to the memory devices. However, the clock to DQS skew may still be one clock cycle off in either direction. Accordingly, data should be written to the memory in manner that compensates for this. For example, the DQ data lines can be held at a DC or constant level while data is written, for example to alternating memory addresses. Once written, this data can then be used for the various read-path calibration procedures that follow. In a specific embodiment of the present invention, these begin with a read deskew procedure, an example of which is shown in the following flowchart.

Figure 6:
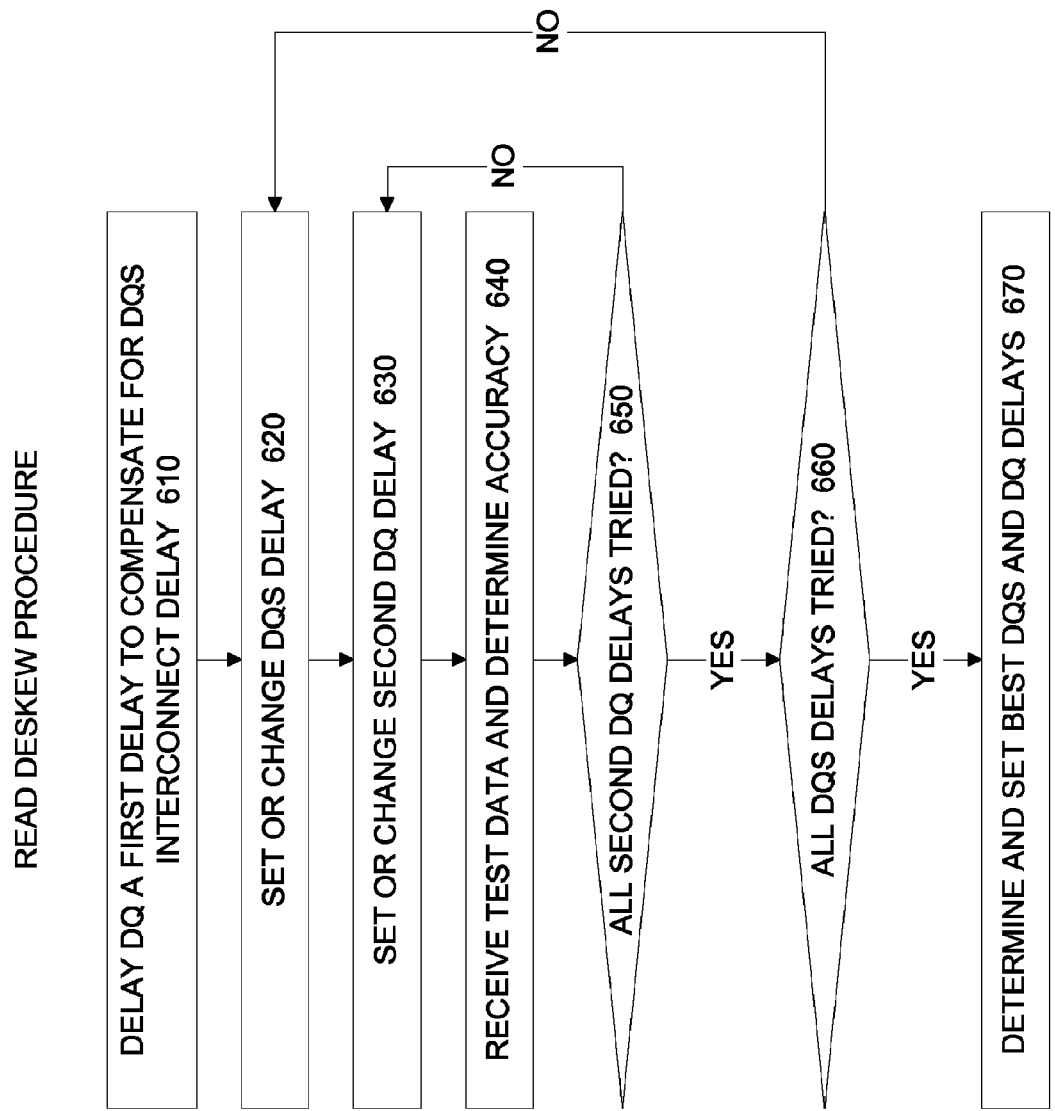
FIG. 6 is a flowchart illustrating a read-path deskew procedure according to an embodiment of the present invention.

FIG. 6 is a flowchart illustrating a read-path deskew procedure according to an embodiment of the present invention. Typically, once on-chip, a DQS input signal is routed to several DQ input registers through a relatively long interconnect path. This path may be a balanced or star-type path such that the delays to the various DQ inputs are matched. This interconnect path produces a delay in the DQS signal. Accordingly, in various embodiments of the present invention, a delay is inserted in the DQ paths in order to compensate for the DQS interconnect delay. To align the DQ paths to the DQS path, data is received while both DQS and DQ delays are adjusted. The accuracy of the received data is determined, and additional delays in the DQS and DQ paths are determined and set.

In this embodiment of the present invention, a DQ delay is swept for each DQS delay setting, though in other embodiments the DQS delay may be swept for each DQ delay setting. Specifically, in act 610, a DQ signal is delayed a first delay to compensate for the interconnect delay caused by the signal path used to route its corresponding DQS signal. It may be that this delay is configured so that the voltage and temperature variation matches the path and not the absolute delay. In act 620, a delay in the DQS path is set. In act 630, a second delay in the DQ path is set. Test data is received and its accuracy determined in act 640. That is, the received test data is examined to see if it was received in an error free manner. This may be done by comparing received test data to expected data. Alternately, the data may be received by a circuit that provides a first output when correct data is received and a second output when incorrect data is received. In act 650, it is determined whether all of the second DQ delays have been tried. If not, the second DQ delay is changed in act 630. Once all DQ delays have been tried for a particular DQS delay, then it is determined in act 660 whether all DQS delays have been tried. If they have not, the DQS delay is changed in act 620, and the DQ delay is swept again. Once all DQS delays have been tried, the optimal DQS and DQ delays are determined in act 670. Again, this determination may be made by averaging the minimum and maximum DQ and DQS delays where data was correctly received. These delays can then be used during data reads from the memory devices.

In the above example, each DQ setting is tried against each DQS setting. This procedure can be rather time consuming. Accordingly, simpler procedures may be used by various embodiments of the present invention. For example, the DQS delay can be held to a constant value, such as zero, while the DQ delays are swept. Following this, each DQ delay can be held to a constant value, such as zero, while the DQS delay is swept. Circuitry that may be used to implement these procedures is shown in the following figure.

Figure 7:
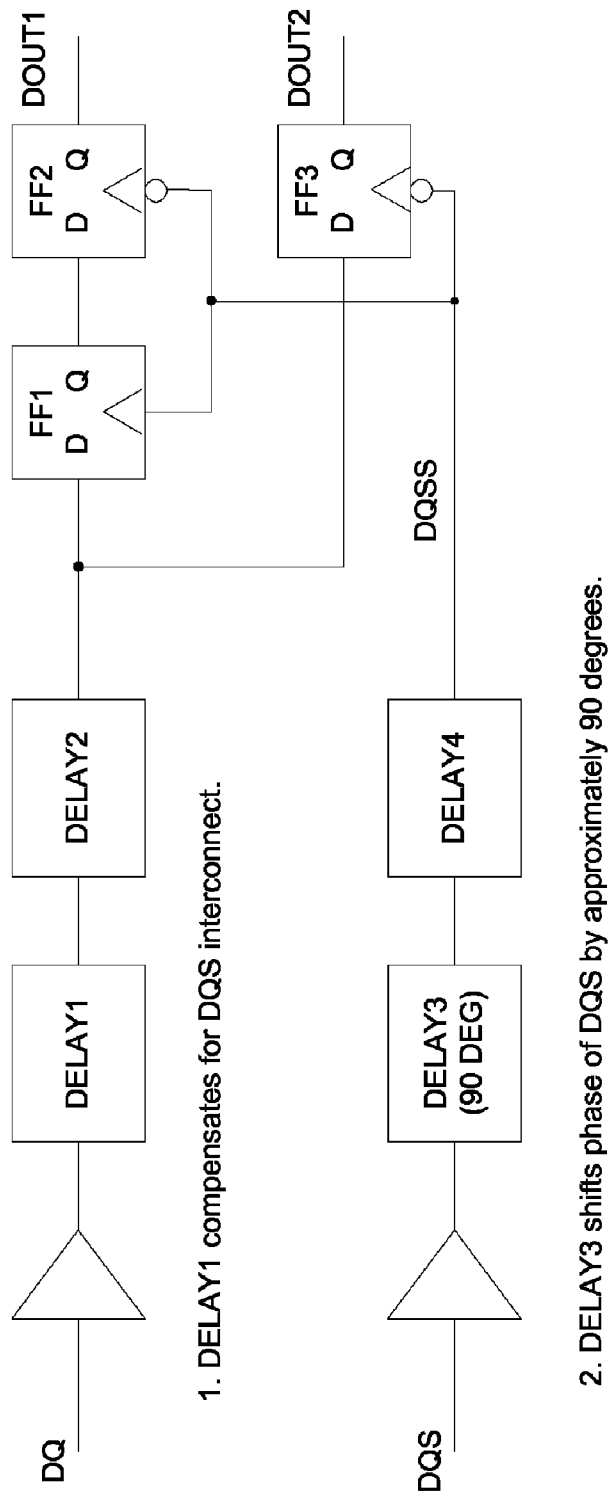
FIG. 7 illustrates a circuit that may be used for read-path deskewing according to an embodiment of present invention.

FIG. 7 illustrates a circuit that may be used for read-path deskewing according to an embodiment of present invention. This figure includes a double-data-rate register including flip-flops FF1, FF2, and FF3. Data for the input register is received from a DQ pin, while the input register is clocked by a DQS signal.

The DQ input signal is received by an input buffer, which provides an output to two delay elements, DELAY1 and DELAY2. The output of DELAY2 is received by the input of the double-data-rate register. In this example, a first delay, DELAY1, is inserted to compensate for the delay resulting from the interconnect path used for DQS routing to the input register or to match the voltage and temperature variation characteristic of the data input path of the register to the clock path. A second delay, DELAY2, is used to deskew the DQ input signal relative to the DQS input signal. The DQS input is received by an input buffer, which provides an output to serially connected delay circuits DELAY3 and DELAY4. Typically, the DQS signals are provided by the memory devices aligned with the DQ signals. For this reason, the DQS signals are delayed by 90 degrees such that the DQS signals can be used to clock the DQ signals. Accordingly, in this example, DELAY3 is used to provide a 90-degree phase shift such that edges of DQSS are centered between edges of the DQ signal when it is received by the double-data-rate register. DELAY4 is inserted to deskew the DQS input signal relative to the DQ input signal.

Typically, the delay provided by DELAY4 is set first, since this effects the timing of each of the DQ signals. The delay DELAY2 is then set for each DQ signal path. In a specific embodiment of the present invention, the delay lines DELAY2 and DELAY4 each have 16 steps, each having 50 ps resolution. This theoretically allows the DQS signal to be centered on a DQ data bit to within 50 ps.

Once the DQ and DQS inputs are deskewed, data can be accurately received by the input double-data-rate registers. However, the input double-date-rate registers are clocked by DQS signals provided by the memory device, and these DQS signals have an indeterminate phase relationship to the internal clock. This complicates the transfer of received DQ data from the DQS domain to the internally clocked domain.

Accordingly, an embodiment of the present invention employs an intermediate register between the input double-data-rate-registers and the registers clocked by an internal clock. This intermediate register is clocked by a clock signal having a delay that is calibrated during calibration procedures consistent with embodiments of the present invention. Specifically, the phase of the intermediate register is adjusted such that set-up and hold times for both the intermediate register and the internal and clocked register are met. A flowchart illustrating a method of performing this synchronization according to an embodiment of the present invention is shown in the following figure.

Figure 8:
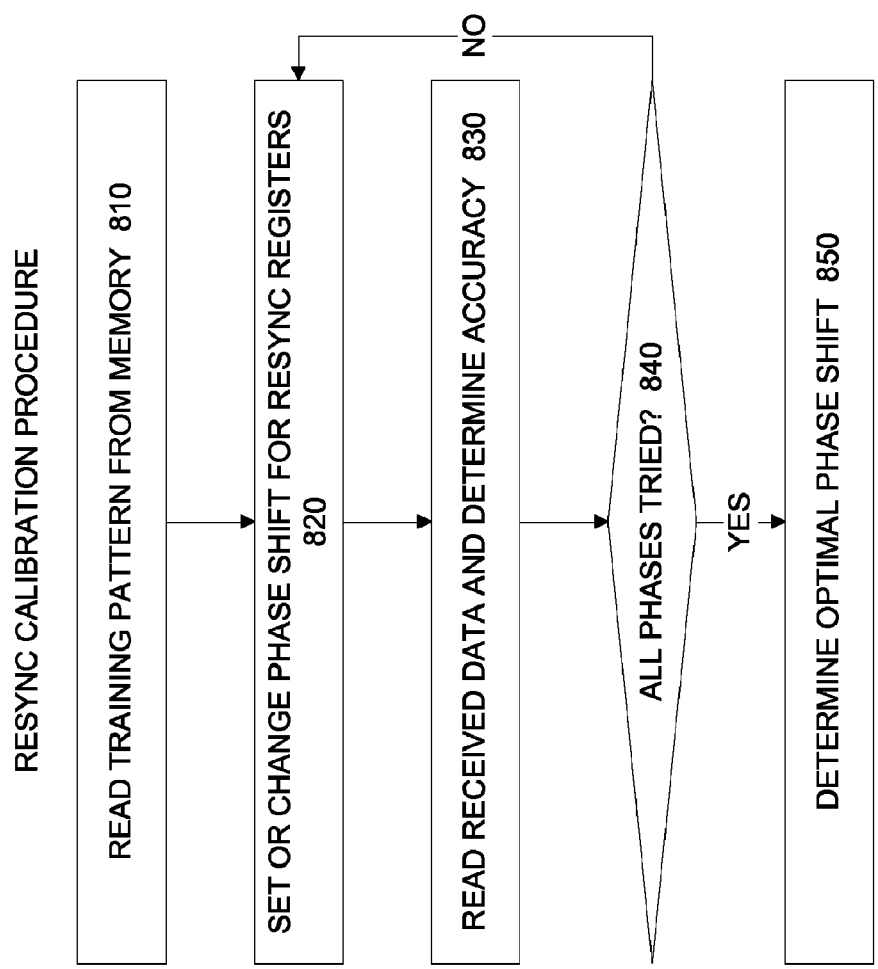
FIG. 8 illustrates a method of synchronizing received data according to an embodiment of the present invention.

FIG. 8 illustrates a method of synchronizing received data according to an embodiment of the present invention. In act 810, a training pattern is received from memory. In act 820, a phase shift for the intermediate or resync registers is set. In act 830, data is read and its accuracy determined. In act 840, it is determined whether all delays have been tried. If they have not, the phase of the resync clock is changed in act 820. Once all phases have been tried, the optimal phase is determined in act 850. This may be done by averaging the minimum and maximum phases where data is transferred correctly. This phase shift may then be used to accurately transfer data from the input double-data-rate registers to an internally clocked register. An example of a circuit that may be used for this calibration procedure is shown in the following figure.

Figure 9:
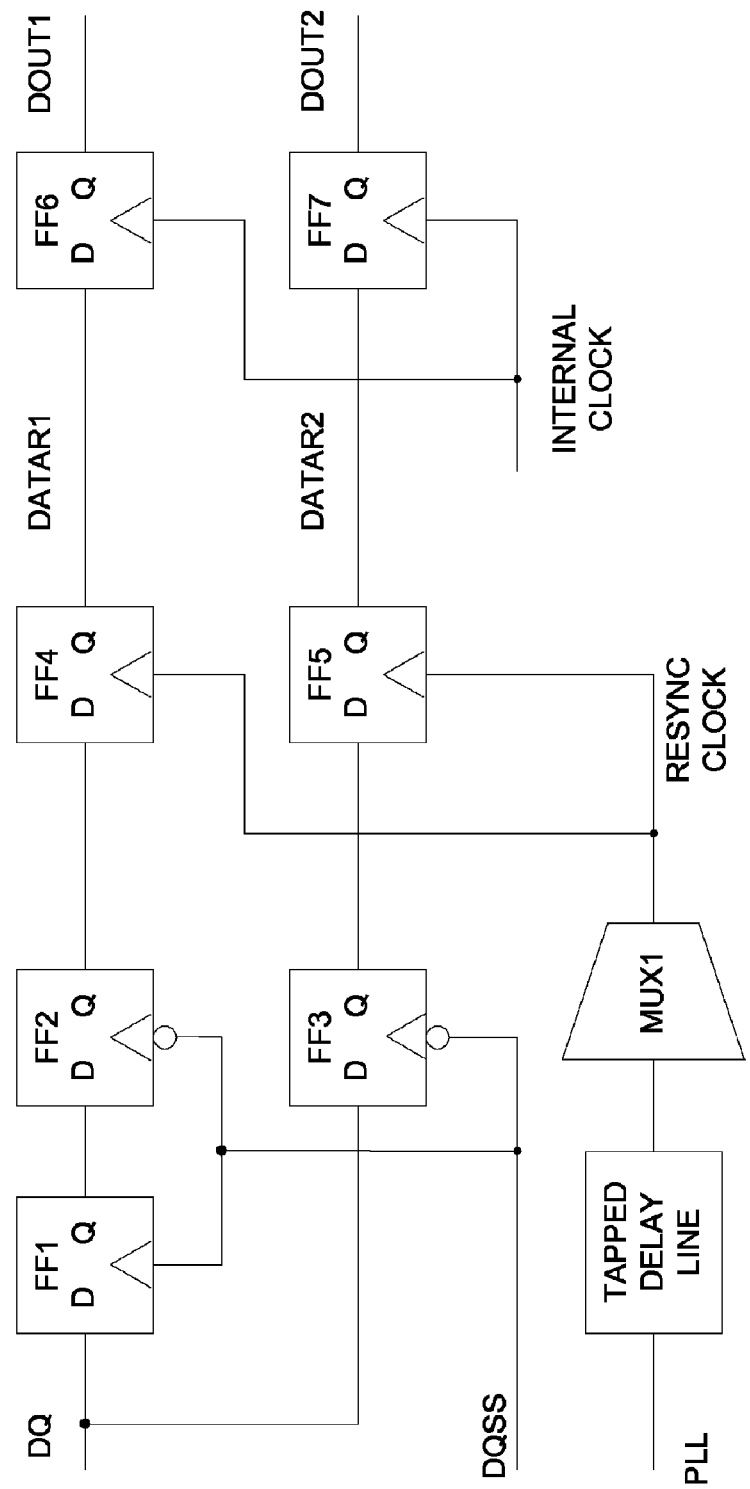
FIG. 9 illustrates a resynchronization calibration circuit according to an embodiment of the present invention.

FIG. 9 illustrates a resynchronization calibration circuit according to an embodiment of the present invention. This circuit includes a double-data-rate register including flip-flops FF1, FF2, and FF3. The outputs of the double-data-rate registers are retimed to a resynchronization clock by flip-flops FF4 and FF5. The outputs of flip-flops FF4 and FF5 are retimed to an internal clock by flip-flops FF6 and FF7.

The resync clock is generated by a tapped delay line and multiplexer MUX1. Specifically, a clock signal from the PLL is received by the tapped delay line. This clock signal may be the same clock signal as the internal clock signal used to clock flip-flops FF6 and FF7. The tapped delay line generates a number of clock signals shifted in phase relative to each other. These clock signals are then selected by multiplexer MUX1 and provided as the resync clock. In a specific embodiment of the present invention, the multiplexer selects each of the tapped delay line outputs in sequence and provides it as the resync clock. For each resync clock, training data is received by the input double-data-rate registers. This data is transferred to the resync registers FF4 and FF5, which transfer the data to the internally clocked flip-flops FF6 and FF7. The accuracy of the data output by the flip-flops FF6 and FF7 is determined for each of the phase-shifted clocks selected by multiplexer MUX1. From this, the optimal resync clock is selected. Typically, the minimum and maximum phase shifted clocks where data is accurately received are averaged, and this average is used in determining which phase should be selected for the resync clock. This positions the phase of the resync clock such that data is transferred from the input registers to the output registers in at least a substantially error free manner. In a specific embodiment of the present invention, the tapped delay line provides a total delay of up to 5 ns divided among six to sixteen taps, the number of taps decreasing with increasing frequency. This allows the resync clock to be positioned with a resolution of the reciprocal of the number of taps used times the clock period. For instance at 400 MHz, one-eighth of a clock cycle granularity is available. This enables a memory interface to meet the DDR3 specification for t(DQSCK).

Again, the DQS signals received during a read are generated by one of the memory devices. The memory devices take their timing from the clock signal, which again is routed using the fly-by topology shown in FIG. 1. The delay of the clock signal due to the fly-by topology may be on the order of one clock cycle or more. Accordingly, after the read path has been deskewed and the delays of the clock for the resynchronization registers have been determined, a read path may remain an entire clock signal skewed relative to other read paths in the memory interface. Accordingly, a 1T register may be inserted or bypassed in order to compensate for this. This register is referred to as a 1T register since it is clocked by the full-speed (1×) clock. A flowchart illustrating a method of making this adjustment is shown in the following figure.

Figure 10:
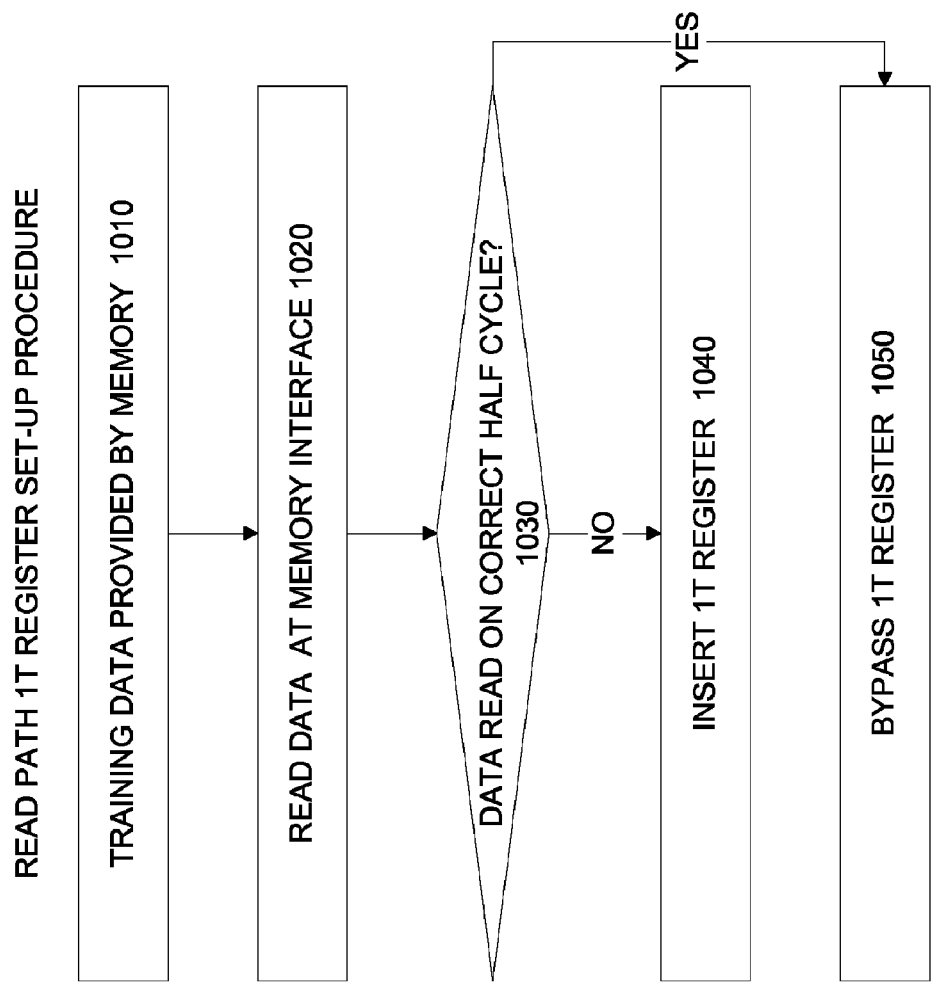
FIG. 10 illustrates a method of setting up a read-path 1T register according to an embodiment of the present invention.

FIG. 10 illustrates a method of setting up a read-path 1T register according to an embodiment of the present invention. In this particular example, the 1T register is initially bypassed. In act 1010, training data is provided by a memory. Data is read at a memory interface in act 1020. In act 1030, it is determined whether the data was received in the correct clock cycle. In a specific embodiment of the present invention, the internally clocked registers perform a two-to-one frequency reduction. Accordingly, in act 1030, it is determined whether data is read on the correct half-cycle. If it is not, the 1T register is inserted in act 1040. If data is read at the correct half-cycle, the 1T register is not needed and remains bypassed. A circuit that may be used for this is shown in the following figure.

Figure 11:
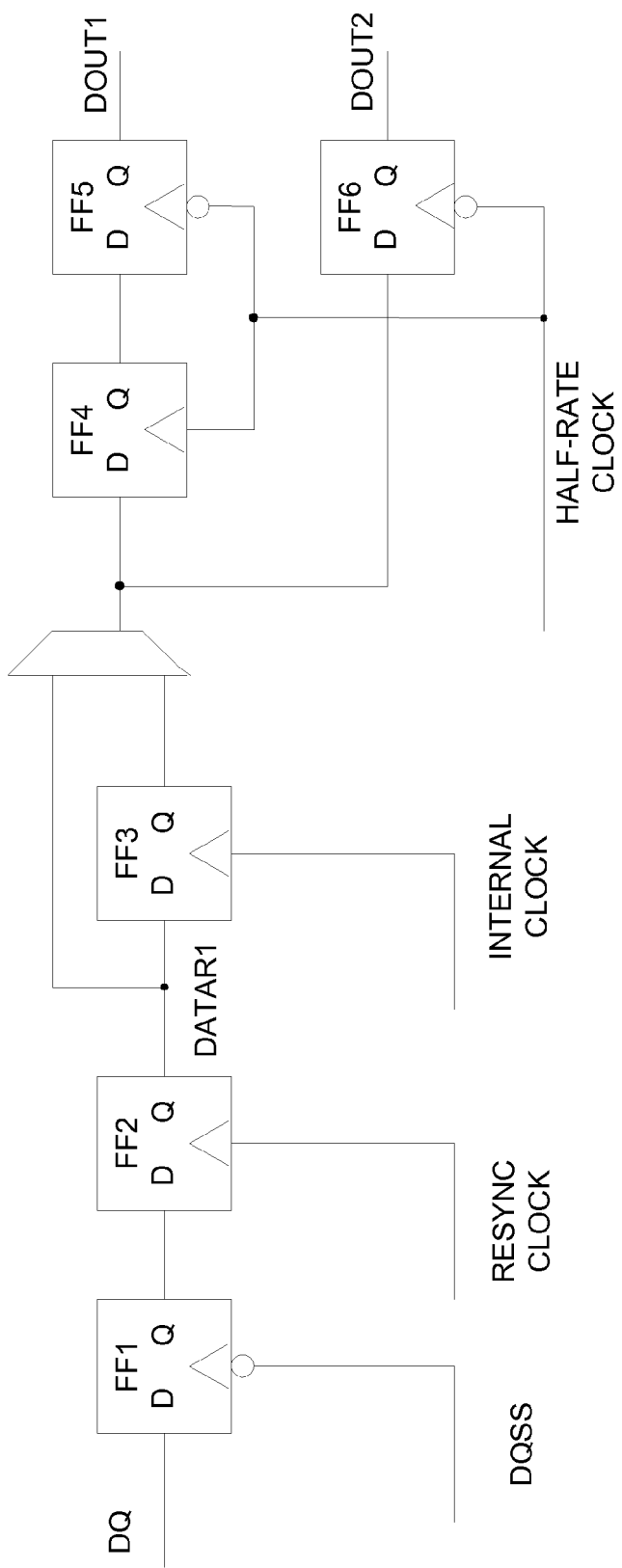
FIG. 11 illustrates an example of a read-path including a 1T register that may be used in an embodiment of the present invention.

FIG. 11 illustrates an example of a read-path including a 1T register that may be used in an embodiment of the present invention. In this example, only one-half of the input double data rate register is shown, specifically flip-flop FF1. Also, only one-half of the resync register FF2 is shown. The 1T register, flip-flop FF3, is clocked by an internal clock. This register may be used or bypassed by a multiplexer that supplies an input to a half-rate register that includes flip-flops FF4, FF5, and FF6. The half-rate registers are clocked by a half rate clock that may be the internal clock divided by two. In this circuit, the 1T register FF3 may be bypassed or inserted by controlling the multiplexer at its output.

As mentioned above, during a data read, the DQS signal is provided on a bidirectional bus by a driver on a memory device. During a read, and for a period of time afterwards that is referred to as a postamble, the DQS signal is active. Following the post postamble period, the DQS driver returns to a high impedance state. At this time, the voltage on the DQS pins float. While the pins are floating, they may be driven by other transients or signals via capacitive coupling to an intermediate voltage. This in turn may result in spurious DQS edges propagating through the read path.

To avoid this, DQS signals are typically gated, for example, by a switch that may be implemented as a logic gate. The gating signal can be referred to as a postamble enable signal. Accordingly, it is desirable to properly time these postamble enable signals to prevent glitches on the DQS lines from causing the spurious clocking of input data registers. An example illustrating the calibration of a postamble enable signal is shown in the following figure.

Figure 12:
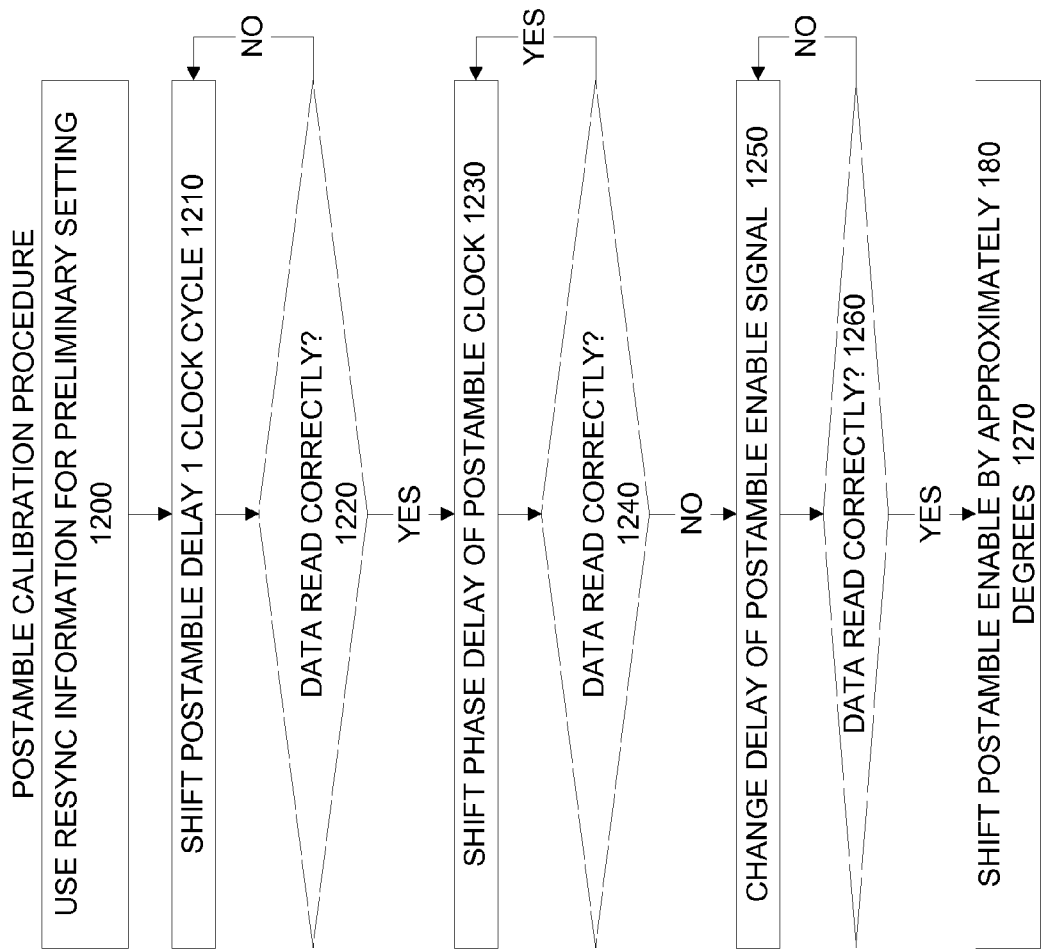
FIG. 12 is a flowchart illustrating a method of calibrating a postamble enable signal according to an embodiment of the present invention.

FIG. 12 is a flowchart illustrating a method of calibrating a postamble enable signal according to an embodiment of the present invention. In this method, the postamble enable signal is initially phase shifted a clock cycle at a time, then a phase of the clocked used to generate the postamble enable signal is varied, after which a delay inserted in the postamble enable signal path is adjusted.

Specifically, information gathered during the resync clock calibration can used to determine a preliminary setting for the postamble enable signal settings in act 1200. In act 1210, the postamble delay is shifted by one clock cycle at a time until the data is read correctly, as determined in act 1220. Once this is complete, the phase delay of the postamble clock is changed until the data is no longer read correctly, as determined in act 1240. In act 1250, the delay of the postamble enable signal is varied until the data is once again read correctly in act 1260. Following this, the postamble enable is shifted by 180 degrees in act 1270. In various embodiments of the present invention, the postamble enable signal is shifted by an amount differing from 180 degrees to compensate for jitter and other inaccuracies that exists during the calibration procedure. An example of a postamble enable signal path is shown in the following figure.

Figure 13:
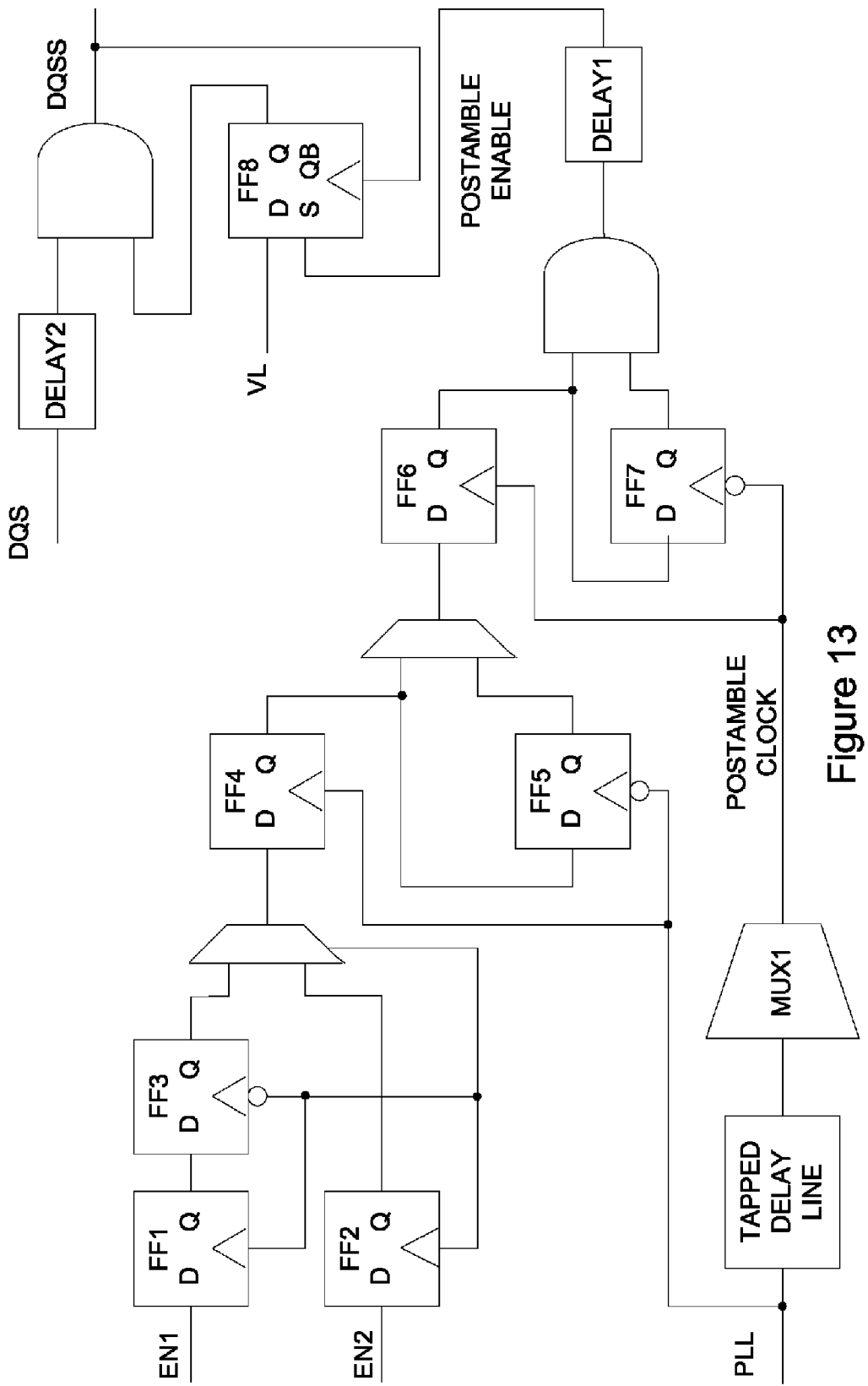
FIG. 13 illustrates a postamble calibration circuit according to an embodiment of the present invention.

FIG. 13 illustrates a postamble calibration circuit according to an embodiment of the present invention. A DQS signal is received and delayed by approximately 90 degrees by DELAY2, the output of which is received by an AND gate. The output of the AND gate provides a DQSS signal, which, as before, clocks one or more input data registers. The other input of the AND gate is driven by the postamble enable register FF8. When the postamble enable register FF8 provides a high output, the DQS signal is allowed to propagate forward as the DQSS signal. When the postamble enable register FF8 provides a logic low output, the DQS signal is blocked and the DQSS signal remains low, independent of the DQS signal. In this state, any level on the DQS signal, including the glitch described above, does not propagate forward to the input register.

The postamble enable register FF8 is set by the postamble enable signal and clocked by the DQSS signal. At the start of a data read, the postamble enable signal sets the postamble enable register FF8 such that it provides a high output allowing DQS to propagate forward as DQSS. At the end of a postamble period, the set signal is removed, and the next following edge of the DQSS signal clocks a low through the postamble enable register, thereby preventing DQS from propagating forward as DQSS.

The postamble enable signal itself is generated from one or more enable signals, shown in this example as EN1 and EN2. The signals are converted, typically in the core of the FPGA, from half-rate signals into full rate signals using flip-flops FF1, FF2, FF3, and its associated multiplexer. This circuitry effectively performs a parallel-to-series conversion. The output serial enable signal is received by flop-flop FF4, the output of which is received by flip-flop FF5. Typically FF4, FF5, and later circuits are located in an input/output circuit section of the FPGA. The flip-flops FF4 and FF5 are clocked on alternating edges of the clock signal. The outputs of these are multiplexed. The multiplexer selects the appropriate output such that the set-up and hold timing for flip-flop FF6 is met.

Flip-flop FF6 is clocked by a postamble clock. The postamble clock is generated by a tapped delay line and multiplexer MUX1. The tapped delay provides a number of clock signals shifted in phase relative to each other. Multiplexer MUX1 selects one of these clock signals and provides it as the postamble clock to flip-flops FF6 and FF7.

Again, the voltages on the DQS lines may glitch at the end of a postamble. This glitch is effectively suppressed by the AND gate under control of the postamble enable signal in the postamble enable register FF8. However, if a second read burst begins shortly after the end of a first read burst (that is, a preamble of second read immediately follows postamble of a first read), what is referred to here as a back-to-back non-consecutive read, the postamble enable signal for the second read burst may allow the glitch to pass through and spuriously clock the input registers. Accordingly, flip-flops FF6 and FF7 shorten the beginning of a postamble enable signal by one-half of a postamble clock cycle. In this way, the enable signal for the second read burst is delayed, and the glitch is not allowed to pass through the DQS AND gate.

Specifically, the outputs of flip-flops FF6 and FF7 are ANDed together. This AND gate does not provide a high signal until both of the outputs of flip-flops FF6 and FF7 high. Since the output of flip-flop FF7 is delayed by one-half of a postamble clock cycle, the output of the AND gate is delayed by one-half of a postamble clock cycle. This signal is then be delayed by DELAY1 to generate the postamble enable signal, which is in turn used to set the postamble enable register FF8.

In various embodiments of the present invention, other adjustments to the read path may be made. In a specific embodiment of the present invention, once the read path has been calibrated, the write-path calibration, begun earlier with write leveling, is completed. In this specific embodiment, the write-path signals are deskewed relative to each other. An exemplary method of achieving this is shown in the following figure.

Figure 14:
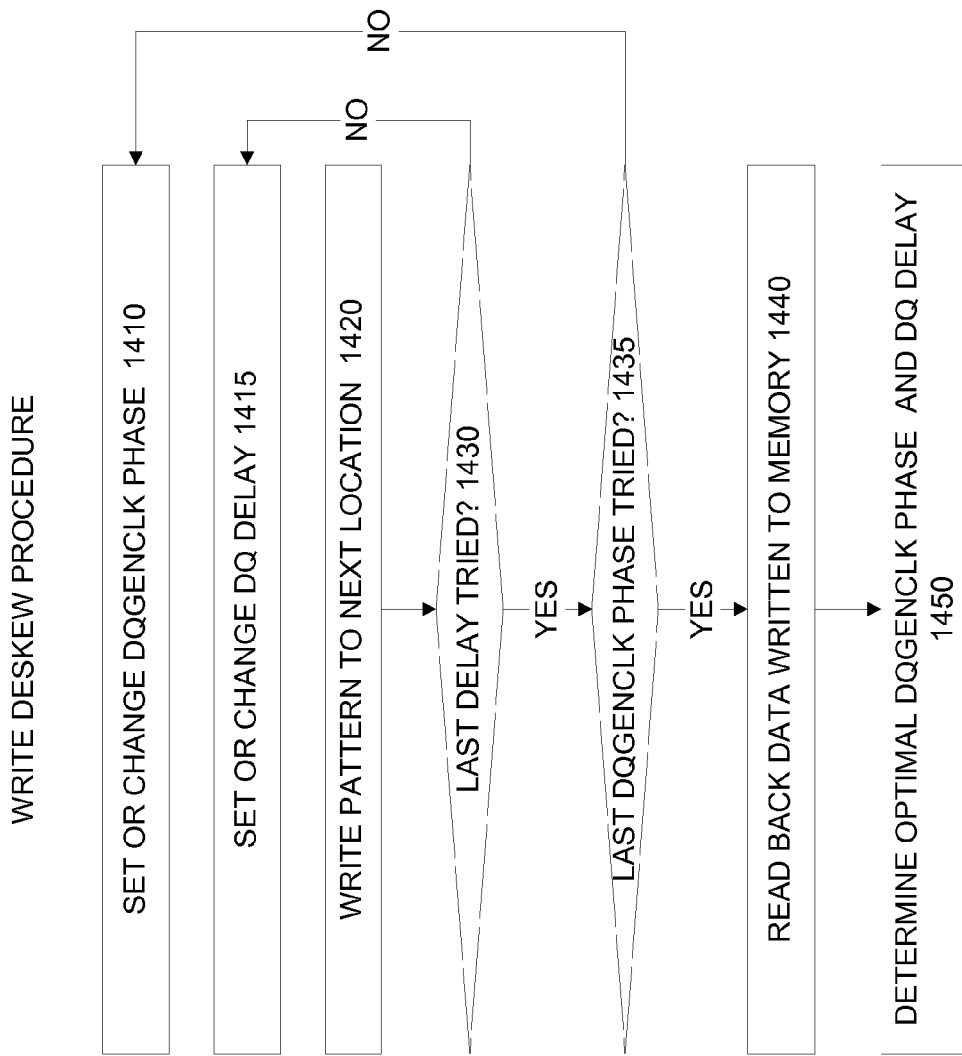
FIG. 14 illustrates a method of deskewing a write path according to an embodiment of the present invention.

FIG. 14 illustrates a method of deskewing a write path according to an embodiment of the present invention. In act 1410, phase of a clock signal, referred to here as DQGENCLK, used to generate a DQ signal, is set with an initial value. In act 1415, a delay inserted in the DQ path is set with an initial value. In act 1420, a write pattern is written to the memory. In act 1430, it is determined whether the last delay has been tried. If not, the delay is changed in act 1415. Once all the delays have been tried, it is determined whether all the phases of DQGENCLK have been tried. If they have not, the phase is changed in act 1410. Once the last phase has been tried, the data that has been written to the memory can be read back in act 1440. Alternately, the data may be read between or interleaved with writes as different delays and phases are tried. From these results, the optimum phase and delay can be determined in act 1450. As before, typically the minimum and maximum skews where data was written correctly to the memory are used in this determination. For example, they may be averaged to determine a skew to be used during device operation.

Again, in typical embodiments of the present invention, the various phase shifting circuits are temperature and supply voltage compensated, while the delays are not compensated. Accordingly, it is desirable that the overall adjustment to DQ timing be done as much as possible with the phase shifting circuits and tapped delay lines. Also, in the above method, each DQ delay is tried for each DQGENCLK phase. Since this can be time consuming, some embodiments of the present invention write data using a limited number of delay settings for each phase setting, or test limited numbers of phases.

Figure 15:
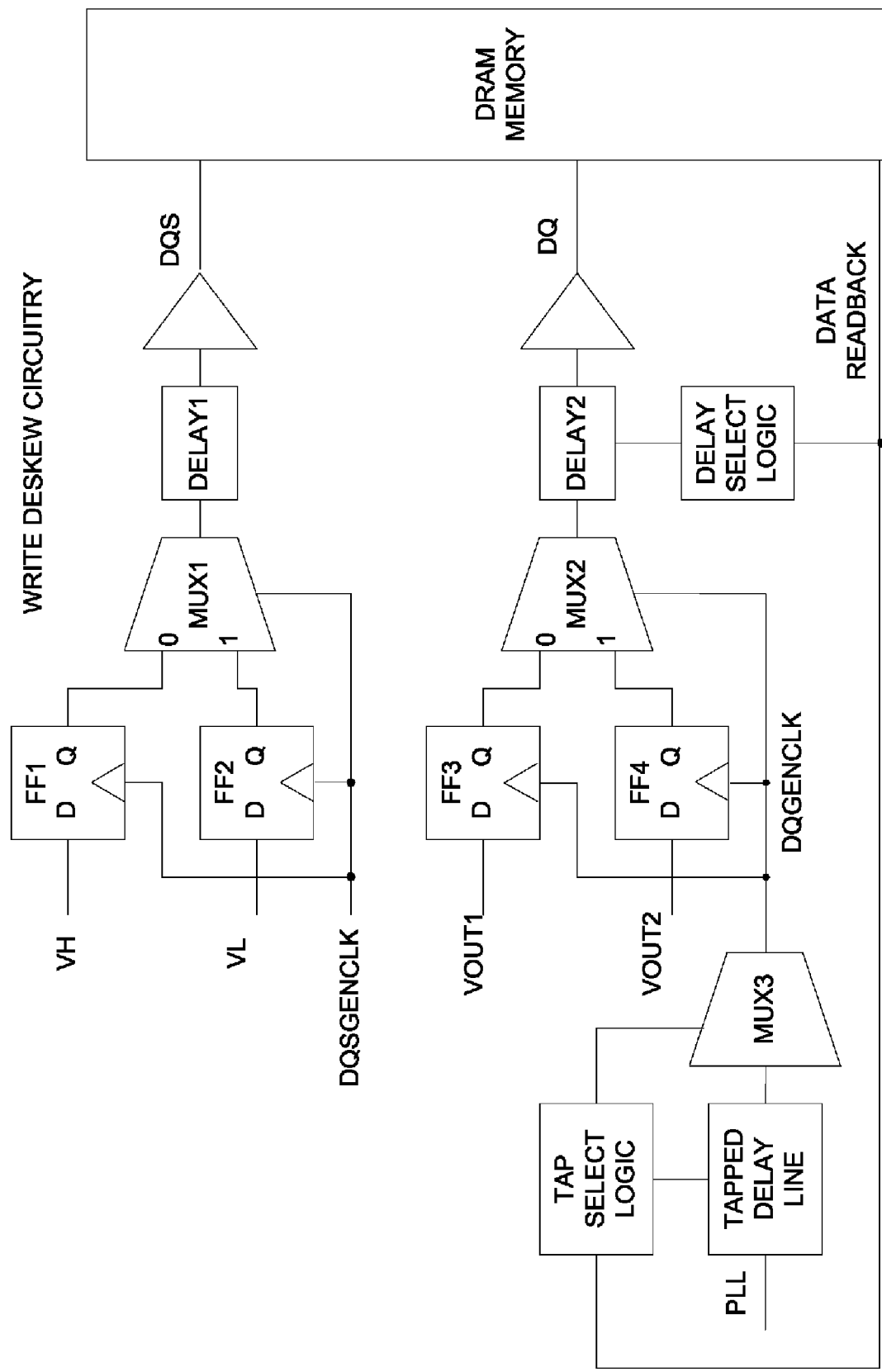
FIG. 15 is a schematic of write deskew circuitry according to an embodiment of the present invention.

FIG. 15 is a schematic of write deskew circuitry according to an embodiment of the present invention. This figure includes circuitry for generating a DQS signal as well as circuitry for generating a DQ signal. The DQS circuitry includes a pair of flip-flops FF1 and FF2, whose outputs are multiplexed by multiplexer MUX1. The output of multiplexer MUX1 is delayed by DELAY1, whose delay can be set during the write leveling procedures described above. The DQS signal is generated using the DQSGENCLK, whose phase is also determined above. The DQS signal is provided to the DRAM memory, which uses it to clock the incoming DQ data.

The DQ data is generated by a pair of flip-flops FF3 and FF4, the outputs of which are multiplexed by multiplexer MUX2. The output of multiplexer MUX2 is delayed by DELAY2, which is under the control of the delay select logic circuit. The DQ signal is generated using the DQGENCLK signal. Typically, one DQGENCLK signal is shared among each DQ in a DQ/DQS group, though other configurations are possible consistent with embodiments of the present invention. The clock signal DQGENCLK is generated by selecting one of a number of clock signals each having a different phase. The clock signals are provided by the tapped delay line and selected by multiplexer MUX3. Again, data is written to the memory and read back on the data read back path. Data read back from the memory is analyzed and used to adjust the phase of DQGENCLK and the delay provided by DELAY2 such that the DRAM memory correctly receives the DQ data. This data may be read back though a DQ or other appropriate pin. In a specific embodiment of the present invention, the tapped delay line provides an overall delay of 2.5 ns divided among eight taps, while the delay line DELAY2 has 15 steps, each 50 ps in resolution. This allows the DQ signals to be adjusted relative to the DQS to maximize the setup and hold times for writes at the memory devices with a resolution of 50 ps.

The various DQS outputs of the memory interface may write to memory devices that are receiving the clock signal CK at times that are more than one clock cycle apart. Accordingly, an embodiment of the present invention includes registers in the write path that may be used or bypassed to adjust the timing by one clock cycle in either direction, either earlier or later. An example of a method of achieving this is shown in the following figure.

Figure 16:
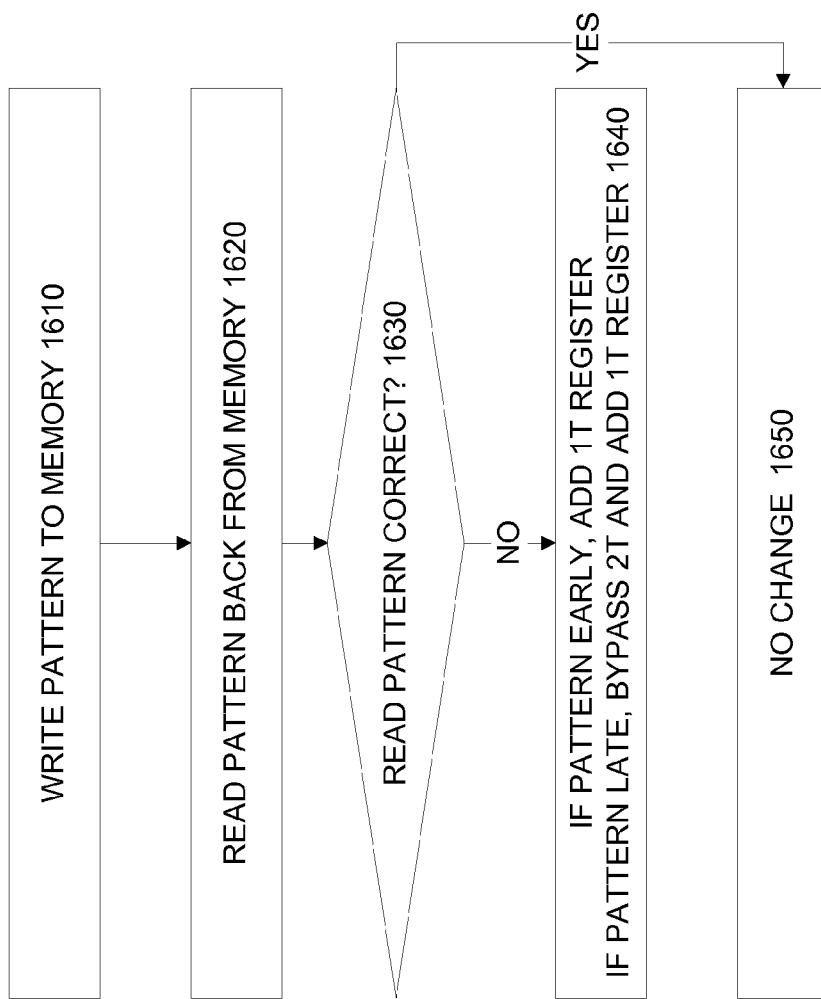
FIG. 16 illustrates a method of setting up a write-path 1T register according to an embodiment of the present invention.

FIG. 16 illustrates a method of setting up a write-path 1T register according to an embodiment of the present invention. In act 1610, a write pattern is written to the memory. The pattern is read back from the memory in act 1620. In act 1630, it is determined whether the pattern has been read back correctly. If the pattern is shifted such that it was received too early by the memory, a 1T register is added. When the pattern is late, a net 1T register is removed by bypassing a 2T register and inserting the 1T register in act 1640. When the pattern has been read back correctly, no change is made in act 1650. A circuit that may be used to implement this method is shown in the following figure.

Figure 17:
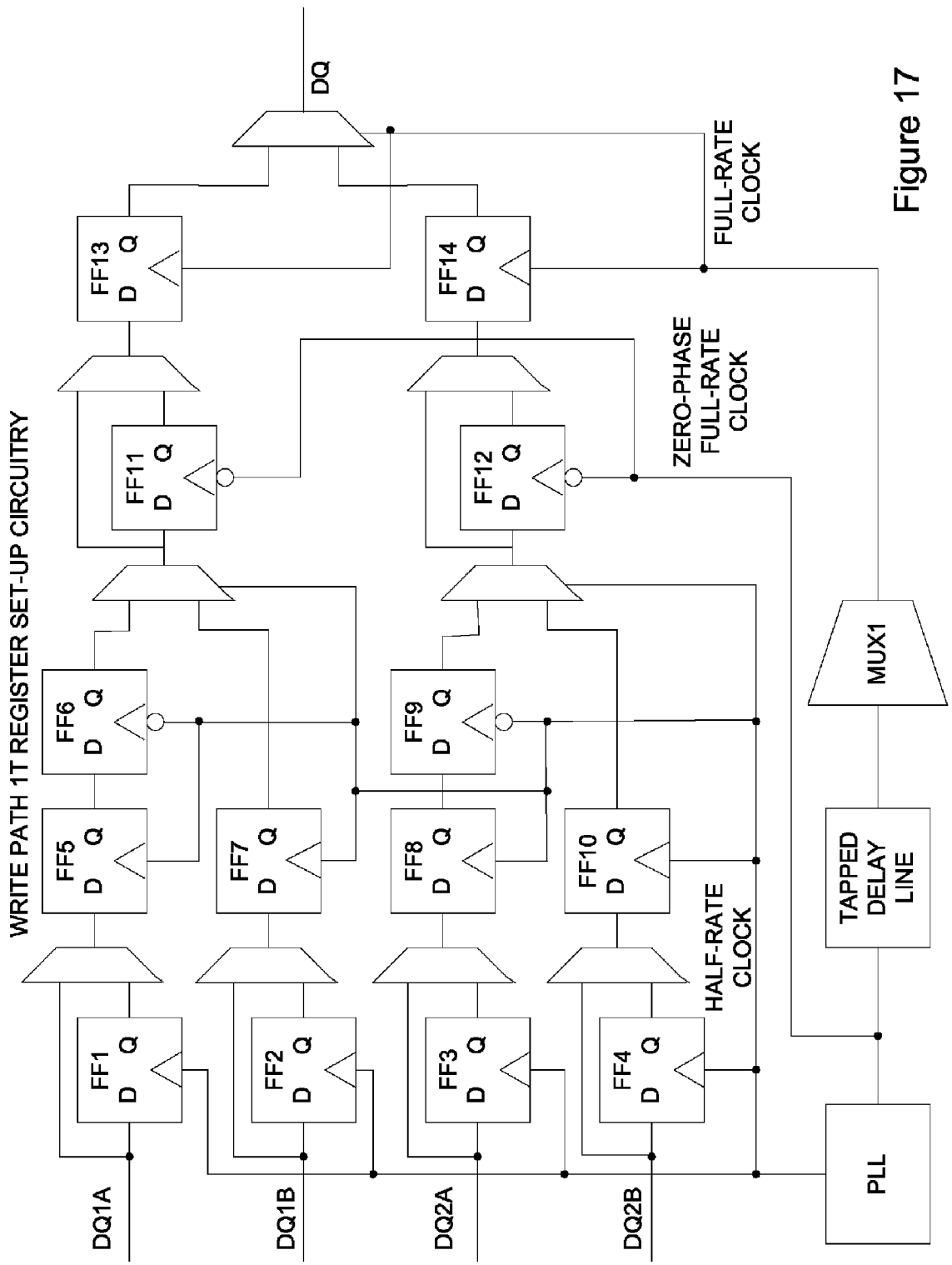
FIG. 17 illustrates a circuit that may be used for the write-path 1T register set-up according to an embodiment of the present invention.

FIG. 17 illustrates a circuit that may be used for the write-path 1T register set-up according to an embodiment of the present invention. In the default mode, the data signals DQ1A-DQ2B are received by half-rate flip-flops FF1 through FF4, which provide outputs to half-rate registers, which in turn serialize their half-rate input signals to full-rate output signals. The full rate signals are then multiplexed to generate a double data rate DQ signal.

Specifically, data is received by 2T registers FF1 through FF4, which in turn provide outputs to a first half-rate register and a second half-rate register. The first half-rate register includes flip-flops FF5, FF6, and FF7, while the second half-rate register includes flip-flops FF8, FF9, and FF10. These each convert their half-rate input signals to full rate output signals. The two full-rate signals are retimed by flip-flops FF13 and FF14, which are multiplexed to produce the double data rate DQ signal.

When data is received at the memory interface early, 1T registers is FF11 and FF12 can be inserted. When data is received late, the data can be advanced one clock cycle by bypassing the 2T registers FF1 through FF4, and in searching the IT registers FF11 and FF12. In this example, registers FF11 and FF12 are clocked by a zero-phase clock, while registers FF13 and FF14 are clocked by a phase shifted clock selected from a Tapped Delay Line. In a specific embodiment, the tapped delay line delays the full-rate clock signal for one clock cycle and has 8 taps, such that the output can be aligned by one-eighth of a clock period. Also, typically the core circuitry operates at the half-rate clock frequency, and registers FF1-FF10 are located in the core circuits, while the faster registers FF11-FF14 are located in the input/output circuitry.

After the read and write paths have been calibrated, the memory device may be used. That is, data may be written to and read from the memory by the memory interface. As time progresses, however, the integrated circuit, including the memory interface, typically experiences environmental changes. These changes may include temperature and supply voltage variations. Accordingly, embodiments of the present invention may update the previously determined calibration settings during the operation of the device. An exemplary flowchart of this is shown in the following figure.

Figure 18:
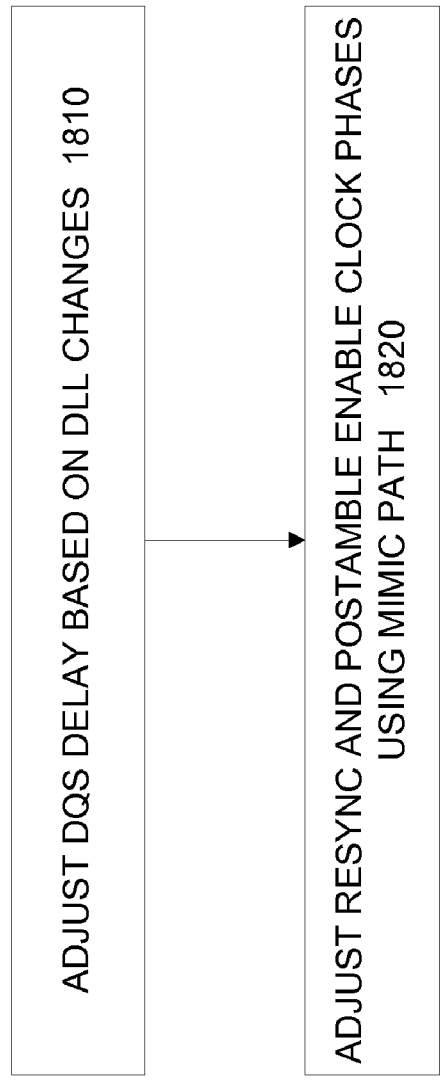
FIG. 18 illustrates a method of tracking calibration changes according to an embodiment of the present invention.

FIG. 18 illustrates a method of tracking calibration changes and updating calibration settings according to an embodiment of the present invention. In act 1810, the DQS delay used to phase shift the DQS signal by 90 degrees is adjusted based on changes in a delay-locked loop. Also, other phase shifts, such as the phase shift circuits or tapped delay lines used to shift clock signals for DQS and DQ signal generation, as well as the phase shift circuits or tapped delay lines used for the postamble enable signal and the resync clocks are adjusted based on changes to the delay-locked loop. The resync and postamble enable clock phases are adjusted using a mimic path in act 1820. Either of these acts may happen continuously (in parallel) or at discrete time intervals. These acts are further detailed in the following figures.

Figure 19:
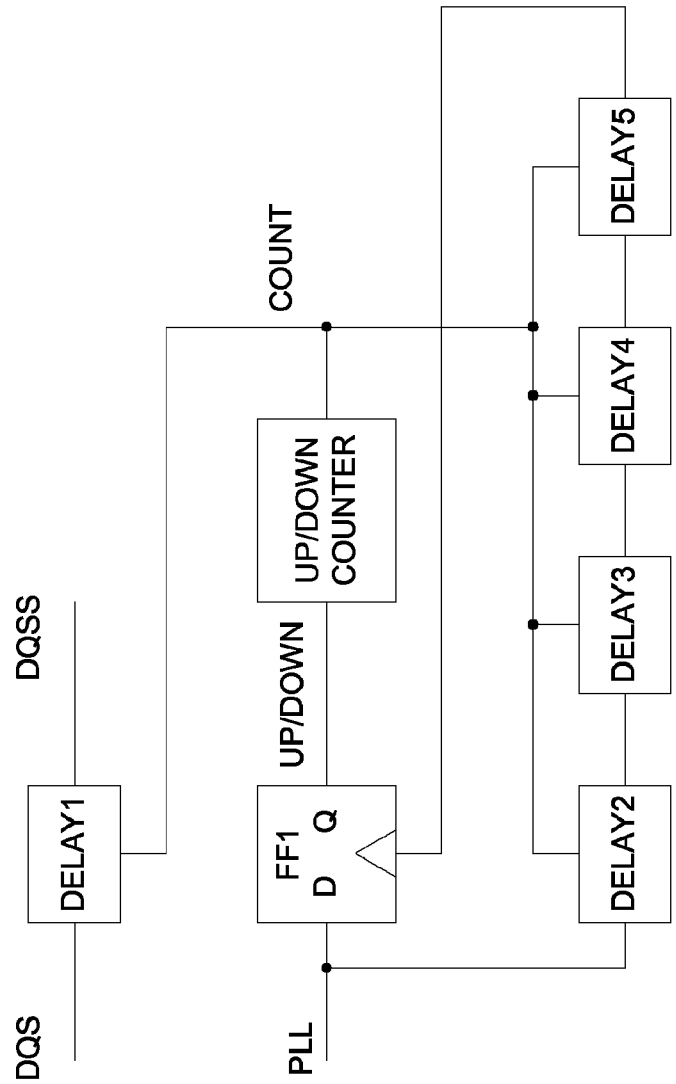
FIG. 19 illustrates a circuit that may be used to set and adjust the delay line responsible for phase shifting the DQS signal by approximately 90 degrees.

FIG. 19 illustrates a circuit that may be used to set and adjust the delay line responsible for phase shifting the DQS signal by approximately 90 degrees. A clock signal generated by a PLL or other source is received by a phase-frequency detector FF1 and a delay line DELAY2. The clock signal is delayed by four matched delay elements, the output of which clocks the phase-frequency detector FF1. The output of the phase-frequency detector provides an up/down count signal, which may also be referred to as an early/late signal, to an up/down counter. The up/down counter updates a count that adjusts the delays through the delay elements DELAY2-DELAY5. This count may be continuously updated, or it may be updated at certain times. In this way, the delay elements DELAY2-DELAY5 provide a 360-degree phase shift to the PLL clock signal. Accordingly, each delay element provides a 90-degree phase shift. The delay of DELAY1 matches the delay elements DELAY2-DELAY5. Accordingly, delay element DELAY1 provides a 90-degree phase shift to the DQS signal. As temperature and supply changes occur, the phase-frequency detector FF1 and the up/down counter adjust the count provided to the delays such that these phase-shifts are maintained. Similarly, the tapped delay lines used in DQ, DQS, postamble enable, and resync clock generation can be adjusted in this way to compensate for temperature and supply voltage changes.

Figure 20:
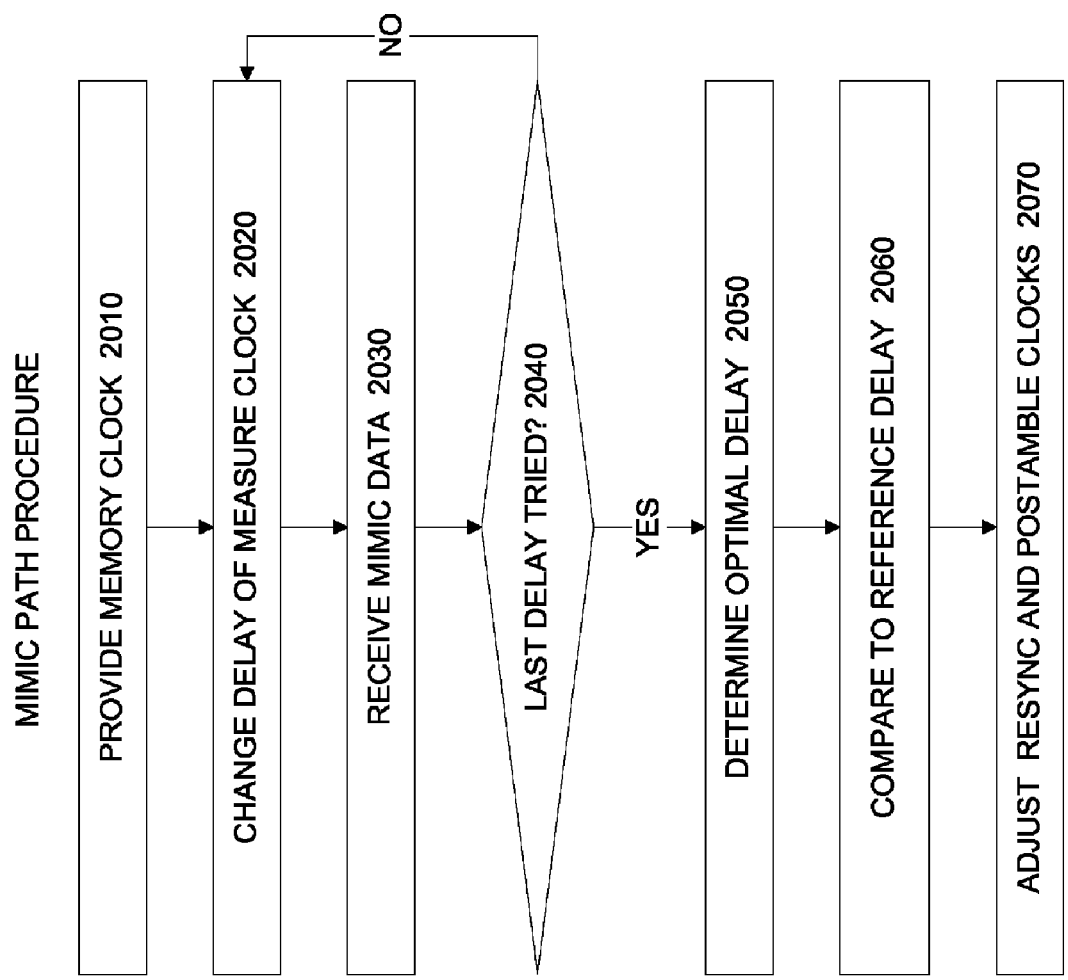
FIG. 20 illustrates the operation of a mimic path according to an embodiment of the present invention.

FIG. 20 illustrates the operation of a mimic path according to an embodiment of the present invention. In act 2010, a memory clock is provided. The phase of a second clock used for the mimic procedure, referred to as a measure clock, is changed in act 2020. Mimic data is received in act 2030. In act 2040, it is determined whether the last delay has been tried. If it has not, the delay of the measure clock is changed in act 2020. Once the last delay has been tried, the optimal delay is determined in act 2050. In act 2060, the optimal delay is compared to a reference delay in a similar manner to setting up resync. In act 2070, the resync and postamble clocks are adjusted in light of this comparison. A mimic circuit that may be used to implement this procedure is shown in the following figure.

Figure 21:
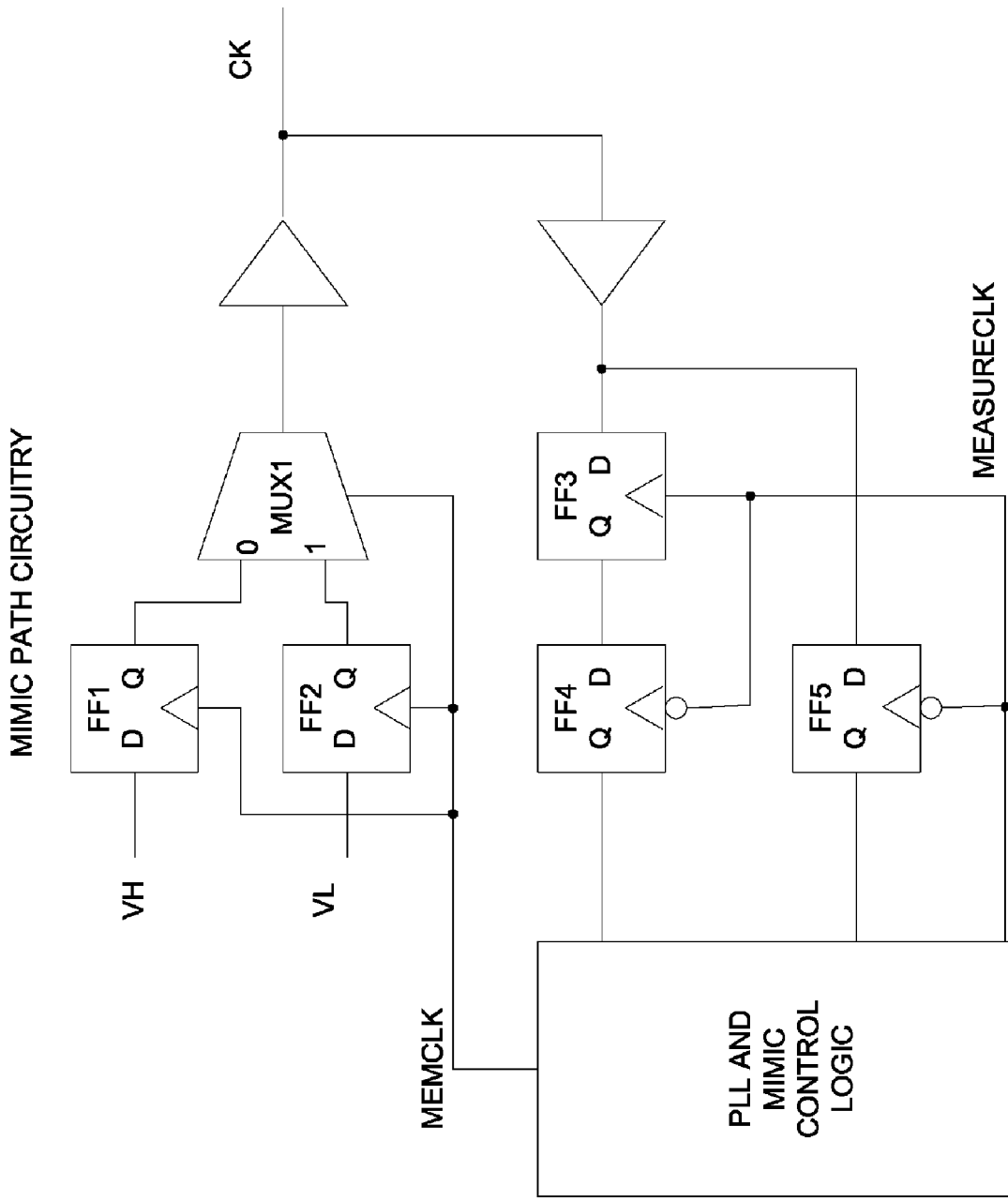
FIG. 21 illustrates a mimic path according to an embodiment of the present invention.

FIG. 21 illustrates a mimic path according to an embodiment of the present invention. This mimic path is arranged to match or mimic the clock output and DQ input paths of the memory interface. A PLL provides a memory clock that, as shown before, is used to generate a clock signal CK. Specifically, the memory clock clocks flip-flops FF1 and FF2, which provide high and low signals that are selected in an alternating fashion by multiplexer MUX1. The clock signal CK is received by mimic input register including flip-flops FF3, FF4, and FF5. The measure clock clocks this input register. The outputs of the input register are received by mimic control logic. After calibration, the phase of the measure clock can be varied to determine the optimal setting for receiving the CK signal. This optimal setting can be retained as a reference setting for comparison to later readings. During tracking, the phase of the measure clock can be varied to determine a new optimal setting. This new optimal setting can be compared to the original reference setting. This comparison can be then be used to compensate for changes in resync and postamble enable signal timing.

Figure 22:
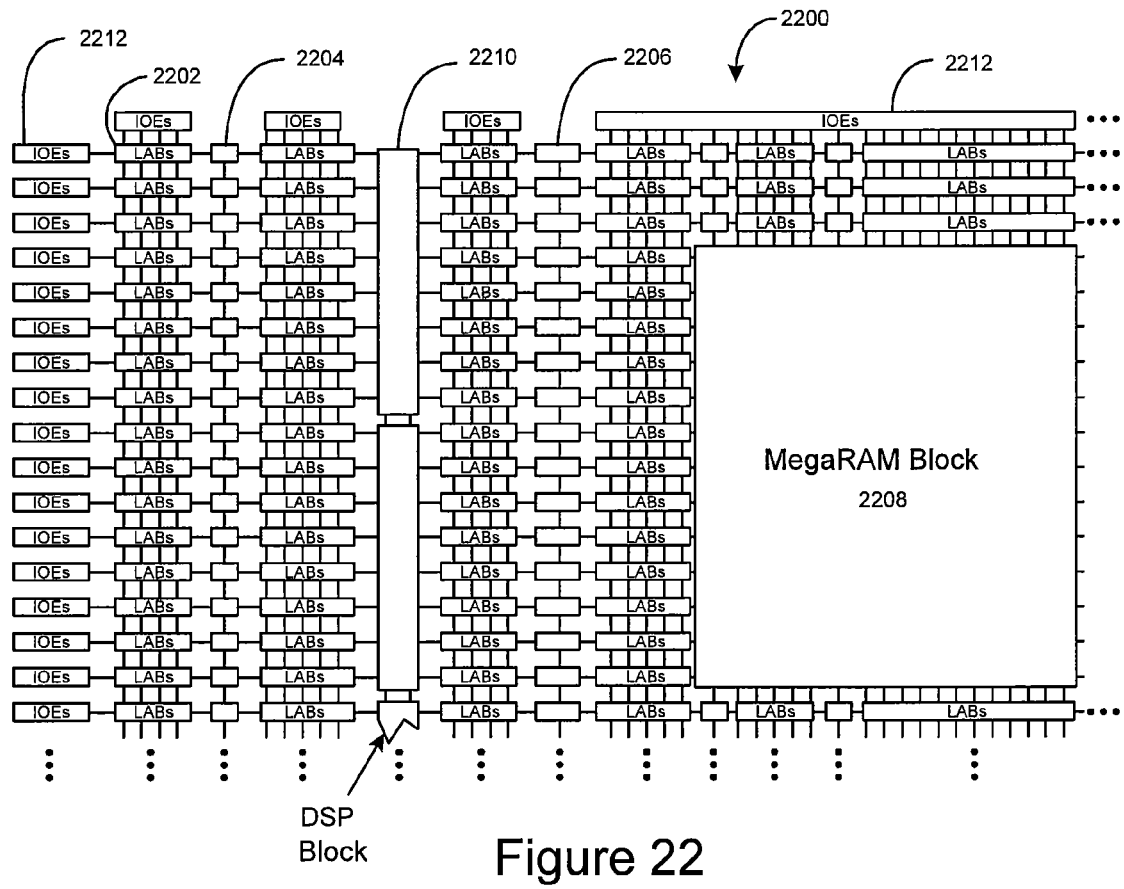
FIG. 22 is a simplified block diagram of a programmable logic device that is improved by incorporating embodiments of the present invention.

FIG. 22 is a simplified partial block diagram of an exemplary high-density programmable logic device or FPGA 2200 wherein techniques according to the present invention can be utilized. PLD 2200 includes a two-dimensional array of programmable logic array blocks (or LABs) 2202 that are interconnected by a network of column and row interconnections of varying length and speed. LABs 2202 include multiple (e.g., 10) logic elements (or LEs), an LE being a small unit of logic that provides for efficient implementation of user defined logic functions.

PLD 2200 also includes a distributed memory structure including RAM blocks of varying sizes provided throughout the array. The RAM blocks include, for example, 522 bit blocks 2204, 4K blocks 2206, and an M-Block 2208 providing 512 bits of RAM. These memory blocks may also include shift registers and FIFO buffers. PLD 2200 further includes digital signal processing (DSP) blocks 2210 that can implement, for example, multipliers with addition or subtraction features.

It is to be understood that PLD 2200 is described herein for illustrative purposes only and that the present invention can be implemented in many different types of PLDs, FPGAs, and the other types of digital integrated circuits.

While PLDs or FPGAs of the type shown in FIG. 22 provide many of the resources required to implement system level solutions, the present invention can also benefit systems wherein a PLD is one of several components.

Figure 23:
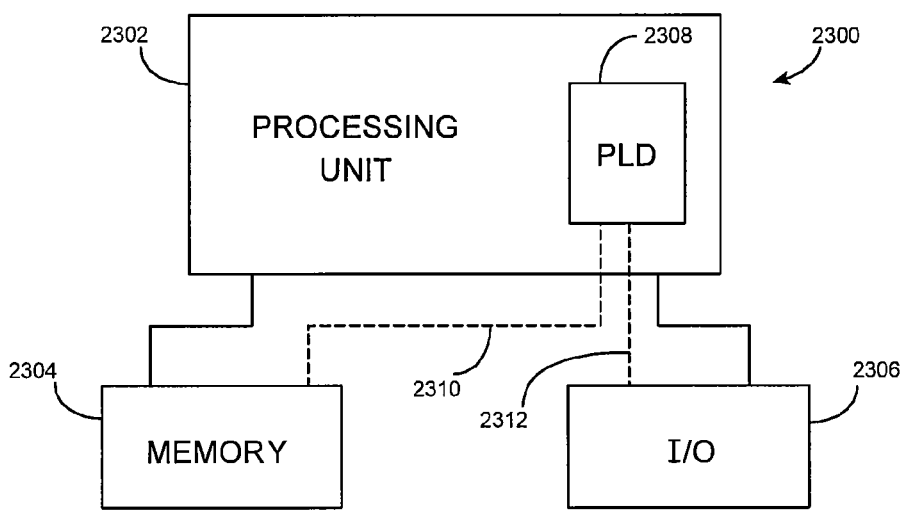
FIG. 23 is a block diagram of an electronic system that is improved by incorporating embodiments of the present invention.

FIG. 23 shows a block diagram of an exemplary digital system 2300, within which the present invention may be embodied. System 2300 can be a programmed digital computer system, digital signal processing system, specialized digital switching network, or other processing system. Moreover, such systems may be designed for a wide variety of applications, such as telecommunications systems, automotive systems, control systems, consumer electronics, personal computers, Internet communications and networking, and others. Further, system 2300 may be provided on a single board, on multiple boards, or within multiple enclosures.

System 2300 includes a processing unit 2302, a memory unit 2304 and an input/output unit 2306 interconnected together by one or more buses. According to this exemplary embodiment, a programmable logic device (PLD) 2308 is embedded in processing unit 2302. PLD 2308 may serve many different purposes within the system in FIG. 23. PLD 2308 can, for example, be a logical building block of processing unit 2302, supporting its internal and external operations. PLD 2308 is programmed to implement the logical functions necessary to carry on its particular role in system operation. PLD 2308 may be specially coupled to memory 2304 through connection 2310 and to input/output unit 2306 through connection 2312.

Processing unit 2302 may direct data to an appropriate system component for processing or storage, execute a program stored in memory 2304, or receive and transmit data via input/output unit 2306, or other similar function. Processing unit 2302 can be a central processing unit (CPU), microprocessor, floating point coprocessor, graphics coprocessor, hardware controller, microcontroller, programmable logic device programmed for use as a controller, network controller, and the like. Furthermore, in many embodiments there is often no need for a CPU.

For example, instead of a CPU, one or more PLDs 2308 can control the logical operations of the system. In an embodiment, PLD 2308 acts as a reconfigurable processor, which can be reprogrammed as needed to handle a particular computing task. Alternately, programmable logic device 2308 may itself include an embedded microprocessor. Memory unit 2304 may be a random access memory (RAM), read only memory (ROM), fixed or flexible disk media, PC card flash disk memory, tape, or any other storage means, or any combination of these storage means.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A memory interface comprising:
   clocking circuitry operable to set a phase of a data strobe signal to a first value; and
   calibration circuitry operable to:
   detect a first time interval corresponding to a transition in an amplitude of the data strobe signal received at a memory device;
   detect a second time interval corresponding to a transition in an amplitude of a system clock signal received at the memory device;
   adjust the phase of the data strobe signal from the first value to a second value in response to determining that the first time interval and the second time interval are disjoint, wherein the second value results in the data strobe signal arriving at the memory device prior to the system clock signal; and
   set a delay of the data strobe signal.

2. The memory interface of claim 1, wherein the calibration circuitry is further operable to set the delay of the data strobe signal so that the first time interval and the second time interval overlap at least partially.

3. The memory interface of claim 1, wherein the calibration circuitry is further operable to adjust the phase of the data strobe signal by setting a parameter of a tapped delay line.

4. The memory interface of claim 1, wherein the memory device is configured in a fly-by topology with another memory device.

5. The memory interface of claim 1, wherein the calibration circuitry is further configured to set the delay of the data strobe signal based, at least in part, on a driver variation.

6. The memory interface of claim 1, wherein the calibration circuitry is further configured to set the delay of the data strobe signal so that the data strobe signal and the system clock signal arrive at the memory device at substantially the same time.

7. The memory interface of claim 1, wherein the calibration circuitry is further configured to align a timing of a data pin to correspond to the phase and the delay of the data strobe signal.

8. A method comprising:
setting a phase of a data strobe signal to a first value;
detecting a first time interval corresponding to a transition in an amplitude of the data strobe signal received at a memory device;
detecting a second time interval corresponding to a transition in an amplitude of a system clock signal received at the memory device;
adjusting the phase of the data strobe signal from the first value to a second value in response to determining that the first time interval and the second time interval are disjoint; and
setting a delay of the data strobe signal so that the data strobe signal and the system clock signal arrive at the memory device at substantially the same time.

9. The method of claim 8, wherein detecting the first time interval comprises detecting a low-to-high transition in the data strobe signal.

10. The method of claim 8, wherein detecting the first time interval comprises detecting a low-to-high transition in the system clock signal.

11. The method of claim 8, wherein setting the delay comprises determining a temperature variation in an integrated circuit.

12. The method of claim 8, wherein setting the delay comprises determining a voltage variation in an integrated circuit.

13. A memory interface comprising:
clocking circuitry operable to set a phase of a data strobe signal to a first value; and
calibration circuitry operable to:
detect a first time interval corresponding to a transition in an amplitude of the data strobe signal received at a memory device;
detect a second time interval corresponding to a transition in an amplitude of a system clock signal received at the memory device;
adjust the phase of the data strobe signal from the first value to a second value in response to determining that the first time interval and the second time interval are disjoint; and
set a delay of the data strobe signal so that the first time interval and the second time interval at least partially overlap.

14. The memory interface of claim 13, wherein the calibration circuitry is further operable to adjust the phase of the data strobe signal by setting a parameter of a tapped delay line.

15. The memory interface of claim 13, wherein the memory device is configured in a fly-by topology with another memory device.

16. The memory interface of claim 13, wherein the calibration circuitry is further configured to set the delay of the data strobe signal based, at least in part, on a driver variation.

17. The memory interface of claim 13, wherein the calibration circuitry is further configured to set the delay of the data strobe signal so that the data strobe signal and the system clock signal arrive at the memory device at substantially the same time.

18. The memory interface of claim 13, wherein the calibration circuitry is further configured to align a timing of a data pin to correspond to the phase and the delay of the data strobe signal.

19. The memory interface of claim 13, wherein the calibration circuitry is further configured to set the delay of the data strobe signal by determining a temperature variation.

20. The memory interface of claim 13, wherein the calibration circuitry is further configured to set the delay of the data strobe signal by determining a voltage variation.

* * * * *